United States Patent [19]
Juengling et al.

[11] Patent Number: 5,858,865
[45] Date of Patent: Jan. 12, 1999

[54] METHOD OF FORMING CONTACT PLUGS

[75] Inventors: Werner Juengling; Kirk Prall; Gordon Haller; David Keller; Tyler Lowrey, all of Boise, Id.

[73] Assignee: Micron Technology, Inc., Boise, Id.

[21] Appl. No.: 569,838

[22] Filed: Dec. 7, 1995

[51] Int. Cl.$^6$ ............................................. H01L 21/3205
[52] U.S. Cl. .................... 438/585; 438/696; 438/666; 438/978; 438/673; 438/587; 438/595; 438/672; 438/239
[58] Field of Search ................................. 438/585, 696, 438/666, 978, 673, 595, 587, 239, 672

[56] References Cited

U.S. PATENT DOCUMENTS

| | | | |
|---|---|---|---|
| 3,996,657 | 12/1976 | Simko et al. | 257/316 |
| 4,784,719 | 11/1988 | Schutz | 438/696 |
| 5,014,098 | 5/1991 | Schalis et al. | 257/316 |
| 5,116,460 | 5/1992 | Bukhman | 438/696 |
| 5,234,852 | 8/1993 | Liou | 438/696 |
| 5,236,549 | 8/1993 | Shirakawa et al. | 438/696 |
| 5,304,829 | 4/1994 | Mori et al. | 257/316 |
| 5,378,646 | 1/1995 | Huang et al. | 438/696 |
| 5,420,075 | 5/1995 | Homma et al. | 438/696 |
| 5,500,816 | 3/1996 | Kobayashi | 257/321 |
| 5,517,044 | 5/1996 | Koyama | 257/316 |
| 5,700,706 | 12/1997 | Juengling | 438/595 |
| 5,705,838 | 1/1998 | Jost et al. | 257/309 |

*Primary Examiner*—John F. Niebling
*Assistant Examiner*—Lynne A. Gurley
*Attorney, Agent, or Firm*—Workman, Nydegger & Seeley

[57] ABSTRACT

Within an integrated circuit, a contact plug with a height not extending above the level of the gate/wordline nitride is nonetheless provided with a relatively large contact area or landing pad, significantly larger than the source/drain region to which the contact plug is electrically connected. Methods for producing the inventive contact plug include (1) use of a nitride facet etch, either (a) during a nitride spacer formation etch or (b) during a BPSG etch; (2) using at least one of (a) an isotropic photoresist etch or partial descum to narrow BPSG spacers above the gate/wordline nitride, and (b) a nitride step etch to etch the shoulder area of the gate/wordline nitride exposed by a BPSG etch; and (3) polishing a BPSG layer down to the top of a gate/wordline nitride before any doped polysilicon plug fill, masking for BPSG etch and performing a BPSG etch, etching the photoresist layer through a partial descum, and etching the shoulder area of the gate/wordline nitride exposed thereby.

25 Claims, 24 Drawing Sheets

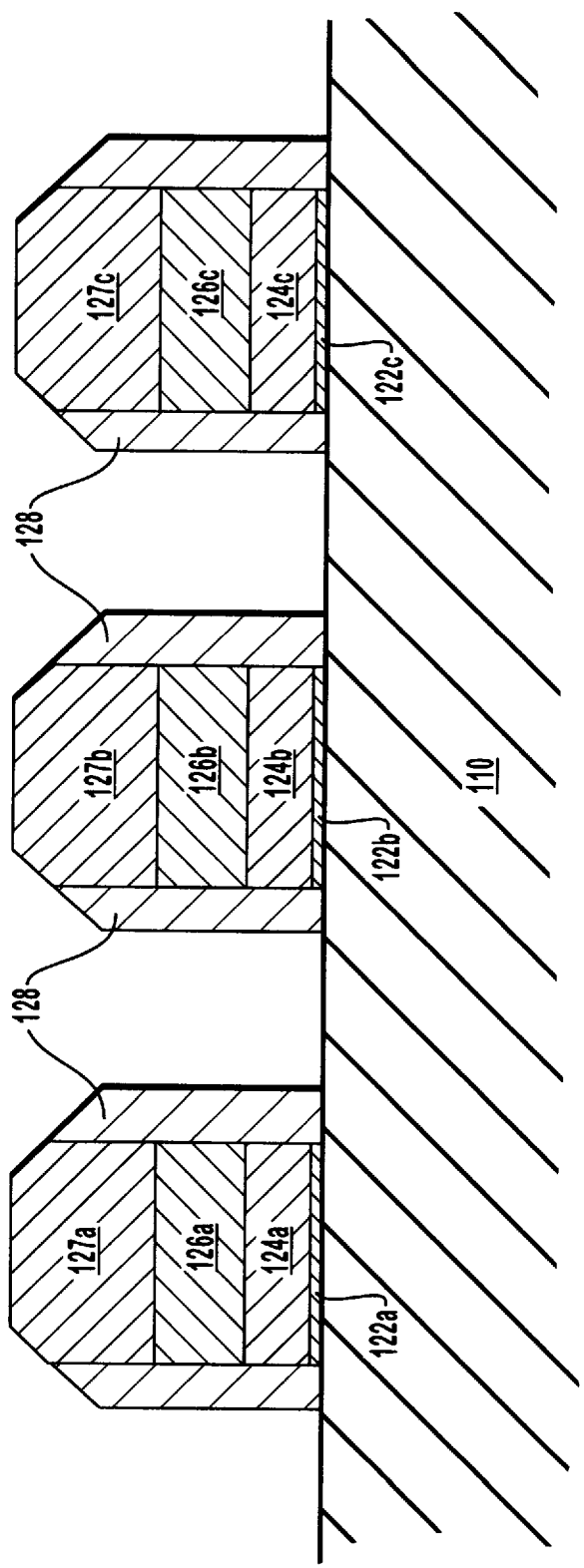

5,858,865

METHOD OF FORMING CONTACT PLUGS

BACKGROUND OF THE INVENTION

1. The Field of the Invention

The present invention relates to the manufacture of semiconductor devices. More particularly, the present invention is directed to novel processes for forming self-aligned polyplugs having large contact areas.

2. The Relevant Technology

FIG. 1 is a flow diagram of selected steps of a conventional process flow for producing DRAM circuits on a silicon substrate, which steps are relevant to the present invention.

At the beginning of the process flow of FIG. 1, silicon wafers have already been processed to the point that gate structures of the DRAM circuits are formed upon the substrate. Nitride is then deposited in the first process step to enclose the gate structures. In the second step, the nitride layer is vertically anisotropically etched to leave only the vertical portions of the layer. In the third step, a thin layer of nitride is redeposited over the gate structures and the substrate.

According to the fourth step of the process flow of FIG. 1, a borophosphorous silica glass ("BPSG") layer is then deposited on the surface of the wafer and flowed or densified to fill the surface features of the wafer. The BPSG forms a dielectric planarization layer. Upon the resulting relatively flat BPSG surface, a plug mask in the form of a patterned photoresist layer is produced in the fifth step using standard photolithography techniques. The resist layer is patterned to shield those areas in which no polysilicon plug is to be formed. In the sixth step, a vertical anisotropic BPSG etch removes the BPSG not vertically shielded by the patterned photoresist layer. In the seventh step, a vertical anisotropic nitride etch removes the nitride layer deposited in the third step, so that the polysilicon plugs can contact the source/drain regions. In the eighth step, the patterned photoresist layer is removed from the wafer.

In the ninth step of the process flow of FIG. 1, doped polysilicon is deposited upon the wafer surface to fill the areas left open by the BPSG and nitride etches. In the tenth step, the polysilicon on the wafer surface is gradually removed from the top downward by chemical mechanical polishing ("CMP"), or dry etch-back, to leave poly plugs only.

FIG. 2 shows a portion of a typical cross section of a partially formed DRAM device after processing through step 5 of the process of FIG. 1.

With reference to FIG. 2, three gate stacks 20a, 20b, 20c have been formed upon a silicon substrate 10. Gate stack 20a includes a doped polysilicon gate 24a topped with tungsten silicide 26a and a thick nitride layer 27a. Polysilicon gate 24a is separated from silicon substrate 10 by gate oxide 22a. The components of the gate stacks 20b, 20c are as described with respect to the like numbered components of gate stack 20a.

Gate stacks 20a, 20b, 20c are enclosed laterally by nitride spacers 28, which have been formed by nitride deposition followed by an anisotropic nitride etch. A second, thin layer nitride deposition has produced nitride film 29. A BPSG layer 30 has been deposited on and flowed over nitride film 29. A patterned photoresist layer 32 has been formed on BPSG layer 30 by photolithography techniques.

FIG. 3 shows the cross section of FIG. 2 after processing through step 6 of the process of FIG. 1, where step 6 is an anisotropic etch of the BPSG layer. The anisotropic BPSG etch has good selectivity of the BPSG layer 30 against the nitride of film 29, leaving nitride film 29 intact with little or no etching thereof, while removing the portions of BPSG layer 30 not shielded by the photoresist.

FIG. 4 shows the cross section of FIG. 3 after processing through steps 7 and 8 of the process of FIG. 1, an anisotropic nitride etch and a photoresist strip. The nitride covering gates 24a, 24b, 24c, is shown for convenience as an undifferentiated nitride layer 31. The anisotropic nitride etch has uncovered source/drain contact regions 34, 36, 38, 40 in silicon substrate 10, and etched small steps 42 into nitride layer 31 covering gates 24a and 24c. Patterned photoresist layer 32 has been removed by the photoresist strip.

FIG. 5 shows the cross section of FIG. 4 after doped polysilicon plug fill and chemical mechanical polishing (CMP) or dry etch-back to a first depth in accordance with steps 9 and 10 or 10A of the process of FIG. 1. Polyplugs 44, 46, 48 have been formed. The CMP or dry etch-back has been applied long enough to isolate plugs that should be isolated according to the circuit layout, but short enough to permit, where desired, local interconnect across gates, such as with polyplug 46 which interconnects across gate 24b. The top surfaces of polyplugs 44, 46, 48, respectively, constitute landing pads 50, 52, 54 for metal contact by a subsequent metalization layer or for contact by other subsequent contact or interconnect layers.

FIG. 6 shows an alternative cross section of FIG. 5 processed according to steps 9 and 10 of the process of FIG. 1, but with the CMP or dry etch-back step performed to a second depth greater than the first depth of FIG. 5. This second depth extends to the level of the top of nitride layer 31. Polyplugs 56, 58, 60, 62 are formed having, respectively, landing pads 64, 66, 68, 70.

CMP or dry etch-back to the second depth seen in FIG. 6 has certain advantages over CMP or dry etch-back stopping at the first depth seen in FIG. 5. First, CMP or dry etch-back to the second depth results in polyplugs having landing pads which are self-aligned with the nitride-enclosed gate structures. Second, a major goal of CMP or dry etch-back is to provide a precisely planarized surface for subsequent processing steps. CMP to the second depth improves the flatness of the polished surface above that of typical CMP because nitride layer 28 polishes away at a much slower rate than both BPSG layer 30 and the doped polysilicon material which forms the polyplugs. Thus polishing is slowed in those areas in which the nitride is reached earliest, resulting in a more even polishing compared to polishing that extends only to the first depth seen in FIG. 5.

The advantages of polishing to the second depth seen in FIG. 5 are tempered by the disadvantages of the small size of landing pads 64, 66, 68, 70. Small landing pads increase the criticality of subsequent alignment steps. A contact etch generally etches both nitride and oxide, so that any misalignment can result in contacts which short between source/drain regions and gates/wordlines. Small landing pad areas also increase the resistance at the contact material/doped polysilicon interface. It would thus be a significant advance to provide the advantages of CMP to the second depth seen in FIG. 6 without the inherent disadvantages of small landing pads.

Even where CMP or dry etch-back is performed only to the first depth shown in FIG. 5, large landing pads do not result if the width of the gate stacks is already at the limit of the resolution of the photolithography system employed. At the resolution limit, the line width of patterned photoresist layer 32 is as shown by outline O in FIG. 2. As seen in FIG. 2, the line width of patterned photoresist layer 32 at the resolution limit approaches the width of gate stacks 20a, 20b, 20c. This results in narrower polyplugs, shown in FIG. 5 by outline N, having smaller landing pads, even with CMP or dry etch-back only to the first level shown in FIG. 5. For gates or wordlines at the resolution limit, a method to increase the size of contact plug landing pads is thus needed, regardless of whether CMP to the second depth shown in FIG. 6 is employed.

SUMMARY AND OBJECTS OF THE INVENTION

An object of the present invention is to provide source/drain contact plugs having large landing pad areas which are self-aligned to adjacent gates.

Another object of the present invention is to create self-aligned source/drain contact plugs having large landing pad areas in relatively few process steps.

Another object of the present invention is to improve the flatness of surfaces produced by CMP.

Another object of the present invention is to increase yield by decreasing the criticality of mask alignment subsequent to completion of source/drain contact plugs.

Another object of the present invention is to allow for smaller minimum feature size by increasing the size of landing pad areas of source/drain contact plugs.

In accordance with one presently preferred process of the present invention, transistors including gate/wordline stacks are formed upon a silicon substrate. Nitride is deposited over the gate/wordline stacks. The nitride is then etched to form nitride spacers enclosing the gates. The nitride etch process includes either a plasma sputter etch or a reactive ion etch with film-forming agents, such that facets are etched in the nitride at top corners of the gate/wordline stacks. Typical processing then follows, but with an optional isotropic etch of the plug mask layer to reduce the line width of the plug mask below the resolution limit of the photolithography system. The facets on the nitride spacers at the top corners of the gate/wordline stacks result in a polyplug having a wider landing pad area, even if CMP or dry etch-back is performed down to a depth of the top of the nitride spacers.

In accordance with another presently preferred process of the present invention, conventional processing is varied by an optional isotropic etch of the plug mask layer to reduce the line width of the plug mask below the resolution limit of the photolithography system, if needed, and by replacing a conventional anisotropic BPSG etch step with a step that both anisotropically etches BPSG and facet-etches the nitride enclosing the gate/wordline stacks. The resulting facets on the nitride spacers at the top corners of the gate/wordline stacks, after further processing, result in a polyplug having a wider landing pad area, even if CMP or dry etch-back is performed down to the nitride.

In accordance with yet another presently preferred process of the present invention, conventional processing is varied by isotropically etching the plug mask layer after it has been patterned, decreasing the effective line width of the plug mask layer. Subsequent standard processing results in wider polyplug landing areas if CMP or dry etch-back is performed down to a level above the top of the nitride. Alternatively, a step feature may be etched in the nitride at the corners of the gate/wordline stacks, which nitride at the corners of the gate/wordline stacks is left exposed after the BPSG etch. Isotropic etching of the plug mask may optionally be used to increase the area of nitride exposed at the corners of the gate/wordline stacks after the BPSG etch. Subsequent processing then results in wider polyplug landing areas even with CMP or dry etch-back performed down to the nitride enclosing the gate/wordline stacks.

In accordance with an additional presently preferred process of the present invention, conventional transistor structures including gate/wordline stacks and source/drain regions are formed upon a silicon substrate, and the gate/wordline stacks are enclosed in nitride spacers. A thin nitride layer is deposited over the entire surface. BPSG is then deposited over the entire surface and densified. A first CMP is then performed down to the level of the nitride enclosing the gate/wordline stacks, producing a flat surface. On the flat surface produced by the first CMP, a patterned plug mask layer is formed. The BPSG left exposed by the plug mask layer is then removed by an anisotropic etch. The plug mask layer is then optionally isotropically etched to increase the area left exposed thereby. The nitride layers left exposed are then anisotropically etched, removing a portion of the nitride at the top corners of the gate/wordline stacks and removing the nitride over the source/drain regions. Subsequent polyplug fill and CMP or dry etch-back down to the nitride result in wider polyplug landing areas and self-aligned polyplugs.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained may be more fully explained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which:

FIG. 9 is a cross-sectional elevation view of the portion of the partially formed DRAM device of FIG. 8 after processing through a complete second step of the process flow of FIG. 7.

DETAILED DESCRIPTION OF THE PREFERRED EMBODIMENTS

In the present invention, polysilicon source/drain contact plugs are produced which, when polished by CMP or etched by dry etch-back down to the level of the gate/wordline nitride, have a contact area or landing pad substantially larger than the source/drain area with which said plugs are associated. The present invention also produces polysilicon source/drain contact plugs having a landing pad substantially larger than the source/drain area with which said plugs are associated even where the size of the associated gate stacks is at the minimum achievable by the photolithography system employed. The present invention includes several novel presently preferred process flows, with variations thereto, for producing large landing pad area contact plugs. While the present invention will be described below in terms of a DRAM device, the present invention is not limited to DRAM devices and will find also use in SRAM, bipolar, and other technologies as will be apparent to those of skill in the art.

Figure 1:
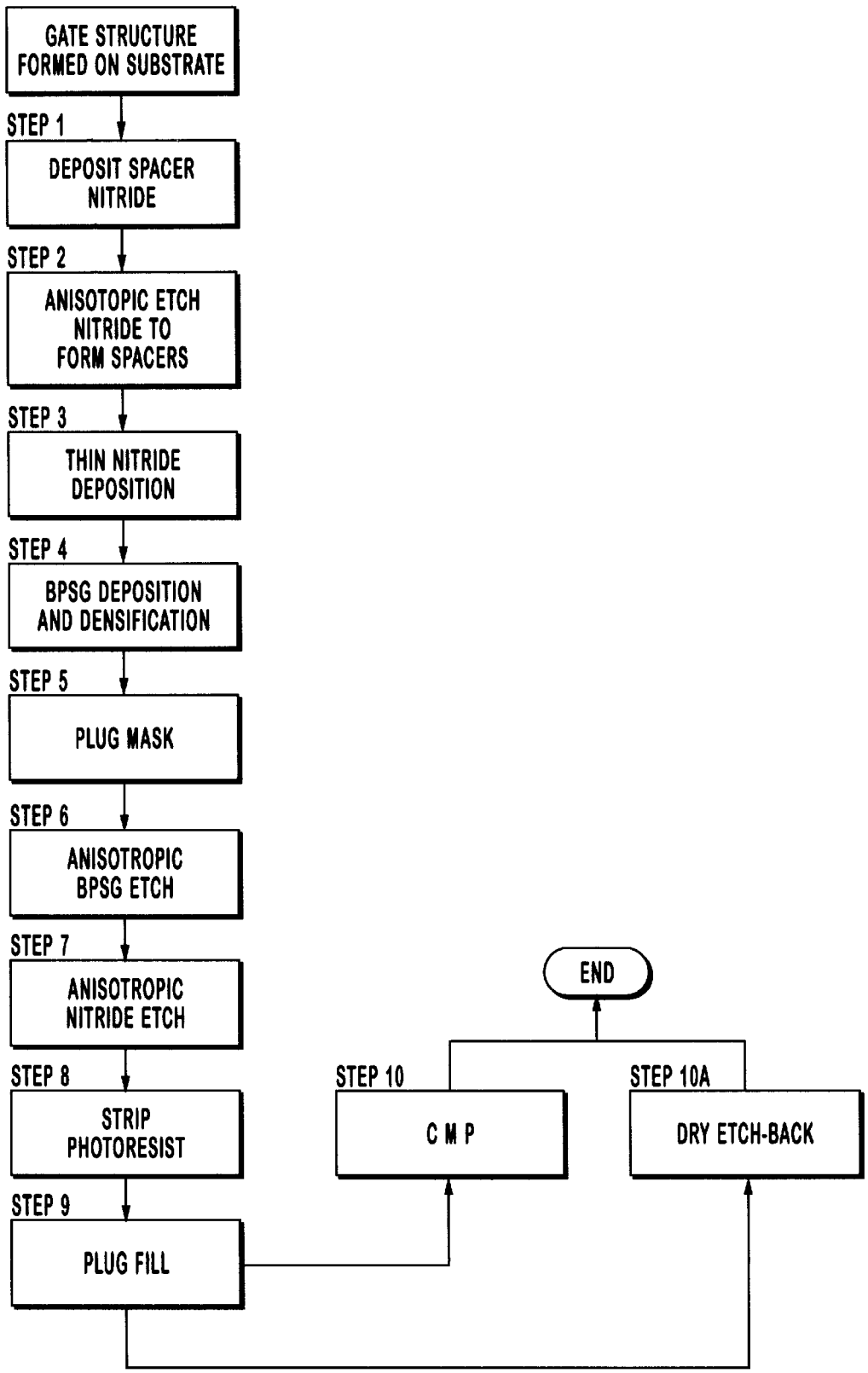
FIG. 1 is a flow diagram illustrating a conventional process flow for producing doped polysilicon plugs for source/drain contacts in a DRAM device.
Figure 7:
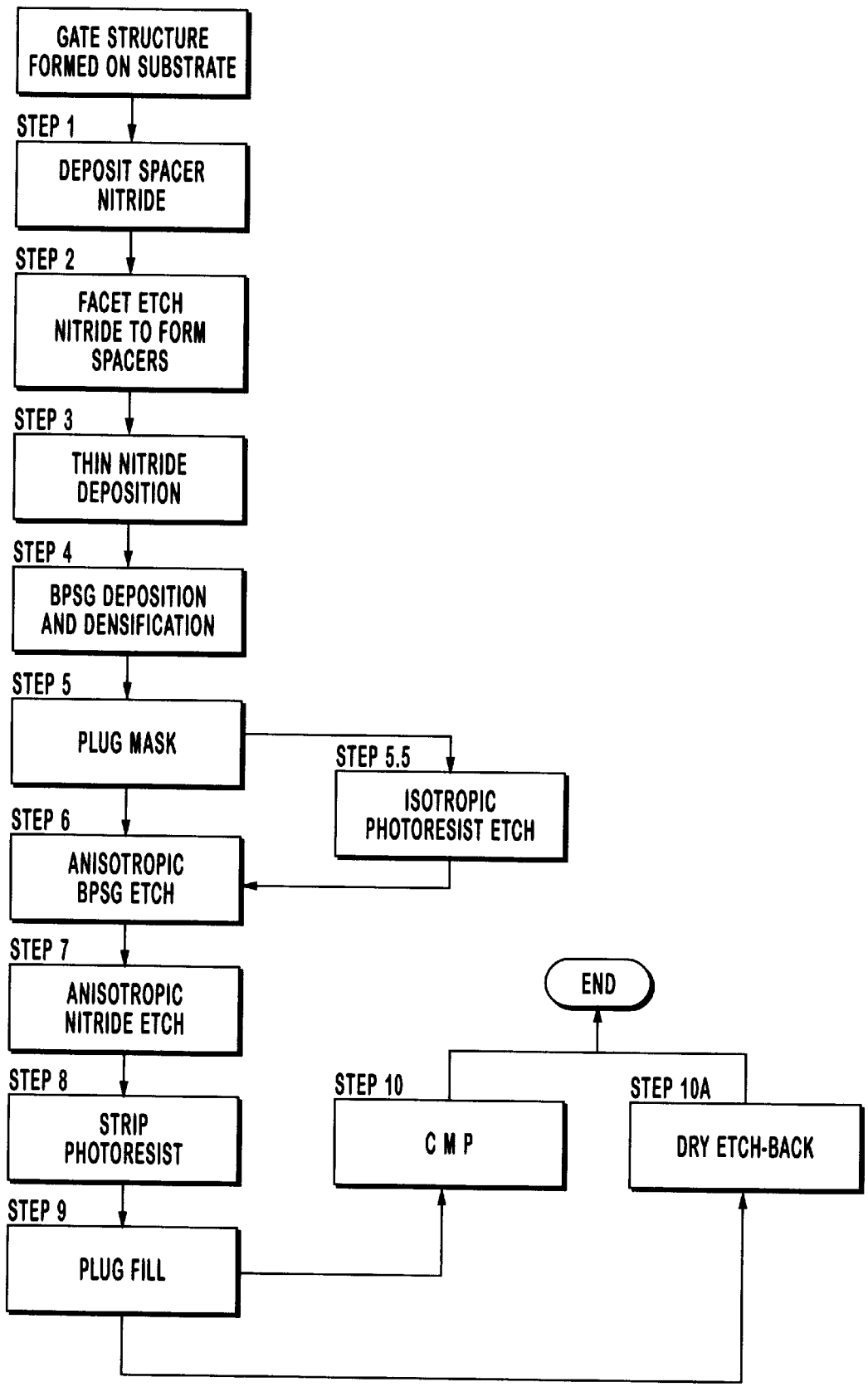
FIG. 7 is a flow diagram of a first process flow according to the present invention for producing self-aligned polyplugs having large landing pad areas.

A first preferred process flow for producing large landing pad area contact plugs is diagrammed in FIG. 7. According to the process of FIG. 7, step 2 of the conventional process shown in FIG. 1, an anisotropic nitride etch, is replaced by a facet etch of the nitride layer. A facet etch etches preferentially at a 45° angle beginning at the portions of the nitride layer covering the comers of each gate structure. A facet etch also etches slowly in the vertical direction, and etches fastest in the horizontal direction.

Figure 8:
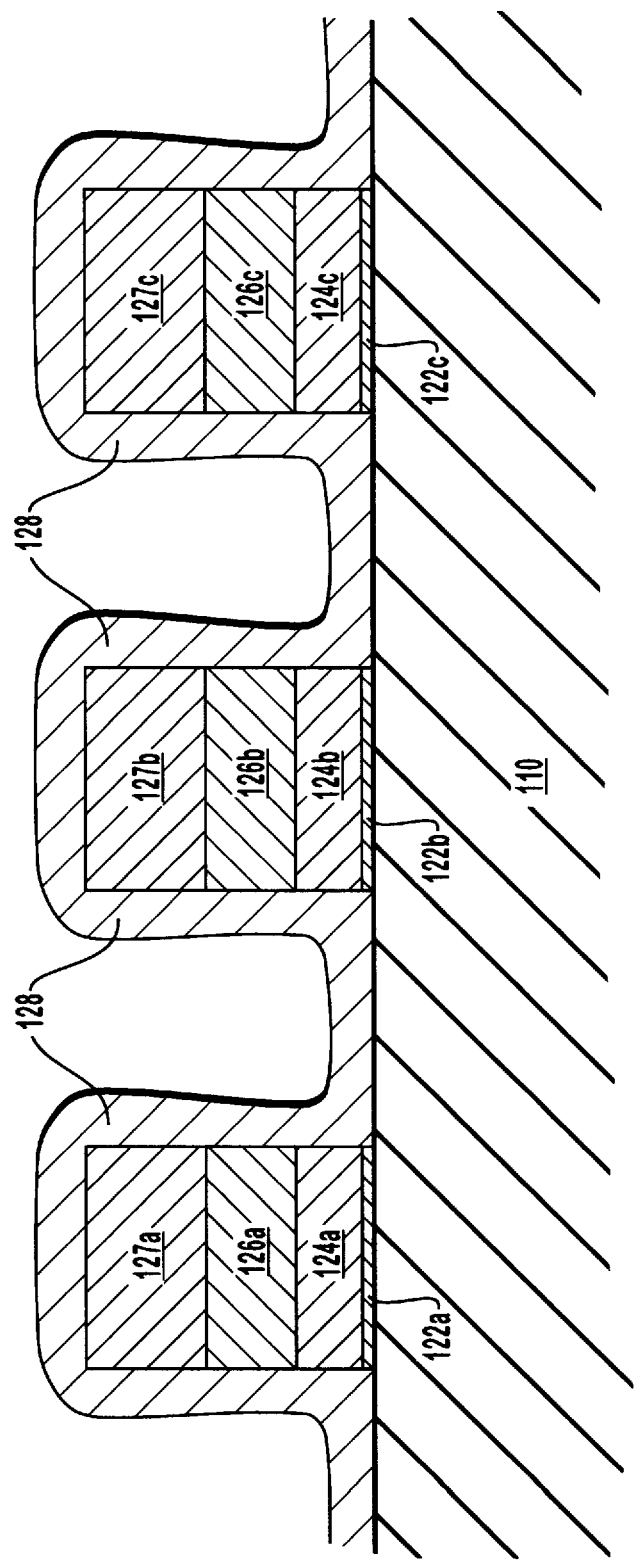
FIG. 8 is a cross-sectional elevation view of a portion of a partially formed DRAM device after processing through the first step of the process flow of FIG. 7.

FIG. 8 is a cross-sectional elevation view of a portion of a partially formed DRAM device after processing through step 1 of FIG. 7, i.e., after formation of transistors upon a silicon substrate, and after deposition of the spacer nitride, and before the facet etch of the spacer nitride which etch forms the desired nitride spacers. Substrate 110 has three gate structures formed thereon, each gate including a gate oxide 122a, 122b, 122c respectively, a polysilicon gate 124a, 124b, 124c respectively, with each polysilicon gate topped by a tungsten silicide layer 126a, 126b, 126c, and a thick nitride layer 127a, 127b, 127c, respectively. All of the gates are enclosed over substrate 110 by a nitride layer 128.

Figure 2:
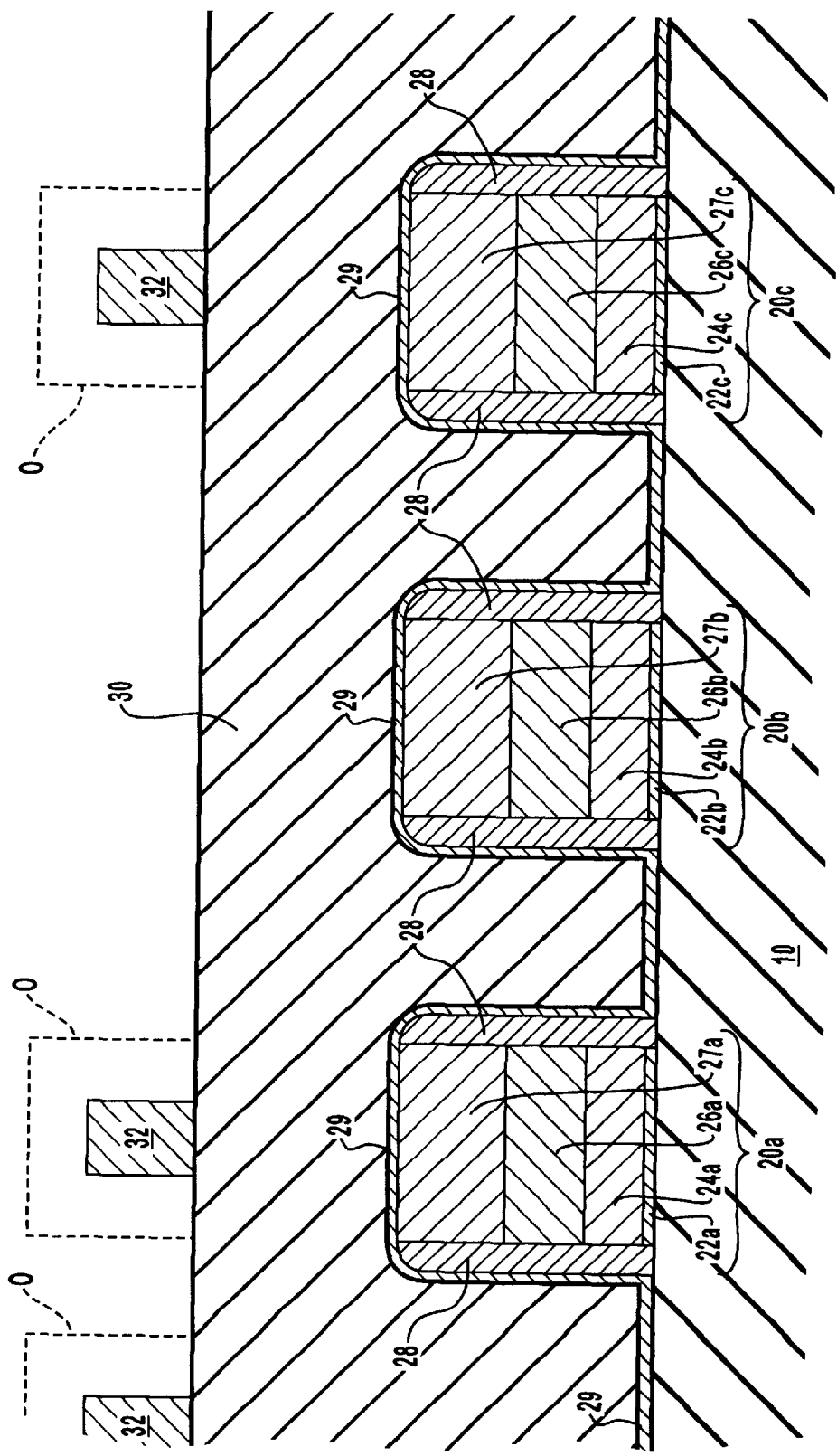
FIGS. 2–4 are cross-sectional elevation views of a portion of a partially formed DRAM device after performance of certain of the conventional processing steps of the process flow diagrammed in FIG. 1.
Figure 3:
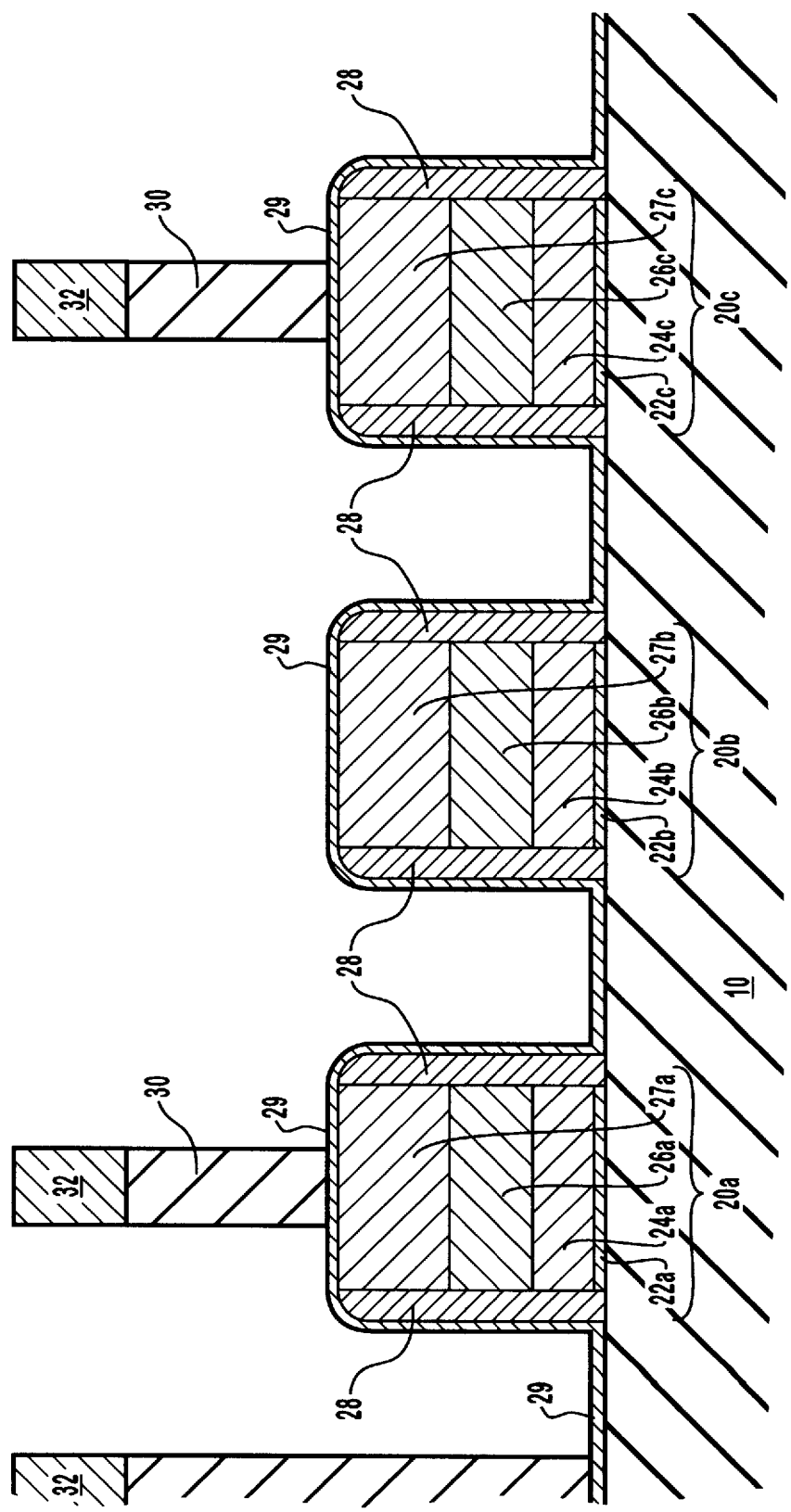
Figure 4:
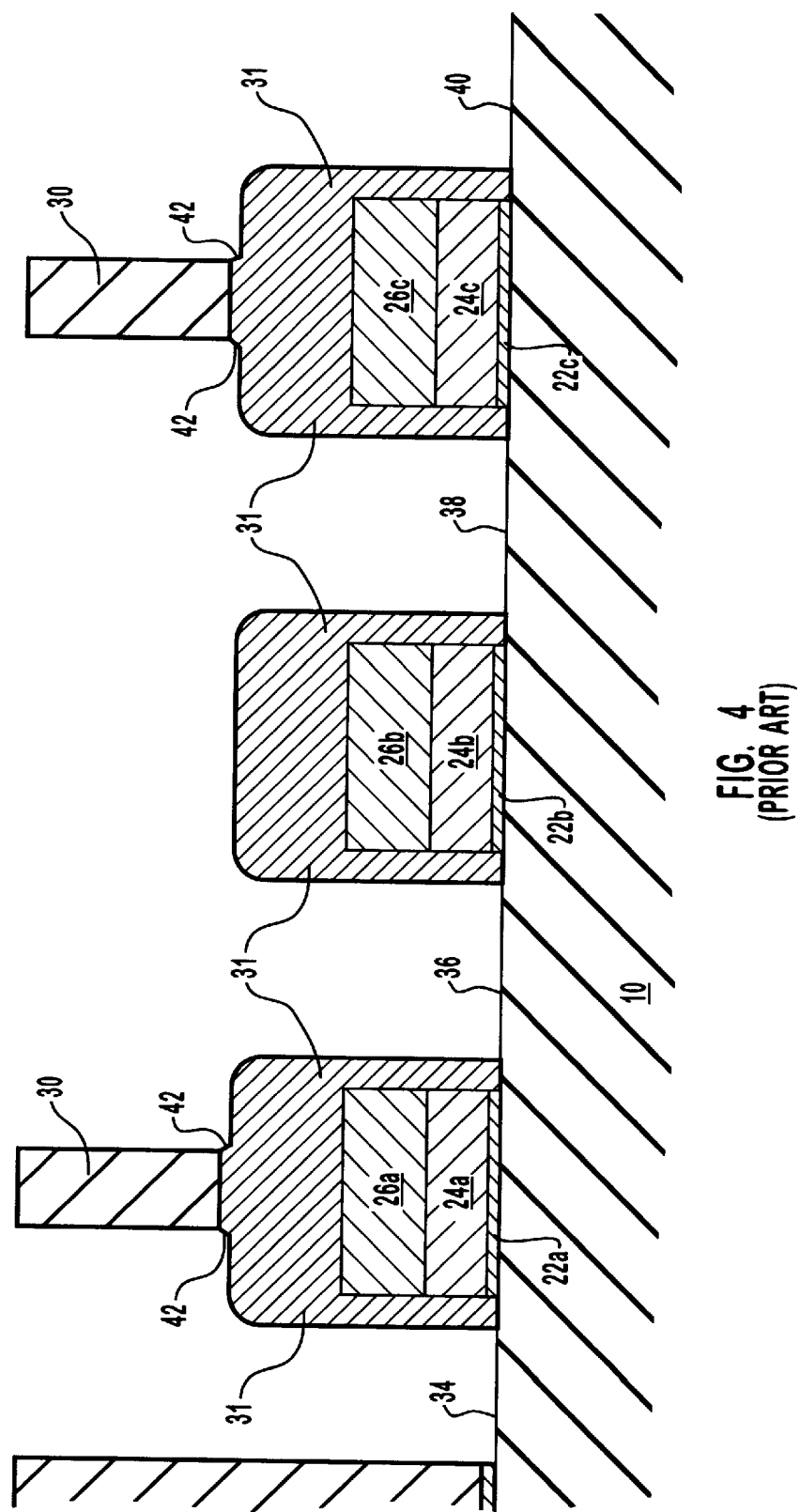
Figure 5:
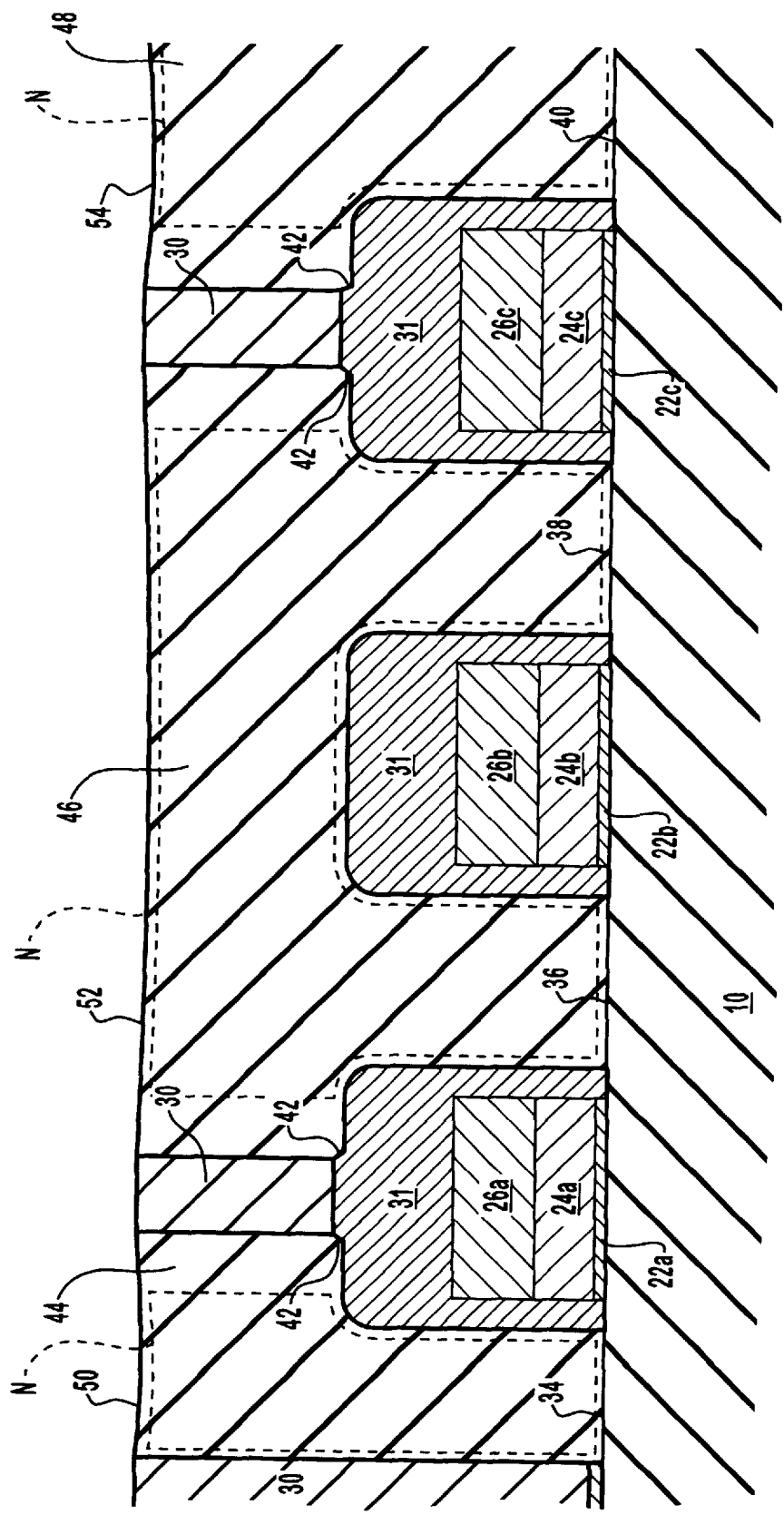
FIG. 5 is a cross-sectional elevation view of the portion of the partially formed DRAM device of FIGS. 2–4 after completion of processing according to the conventional process flow of FIG. 1.
Figure 8A:
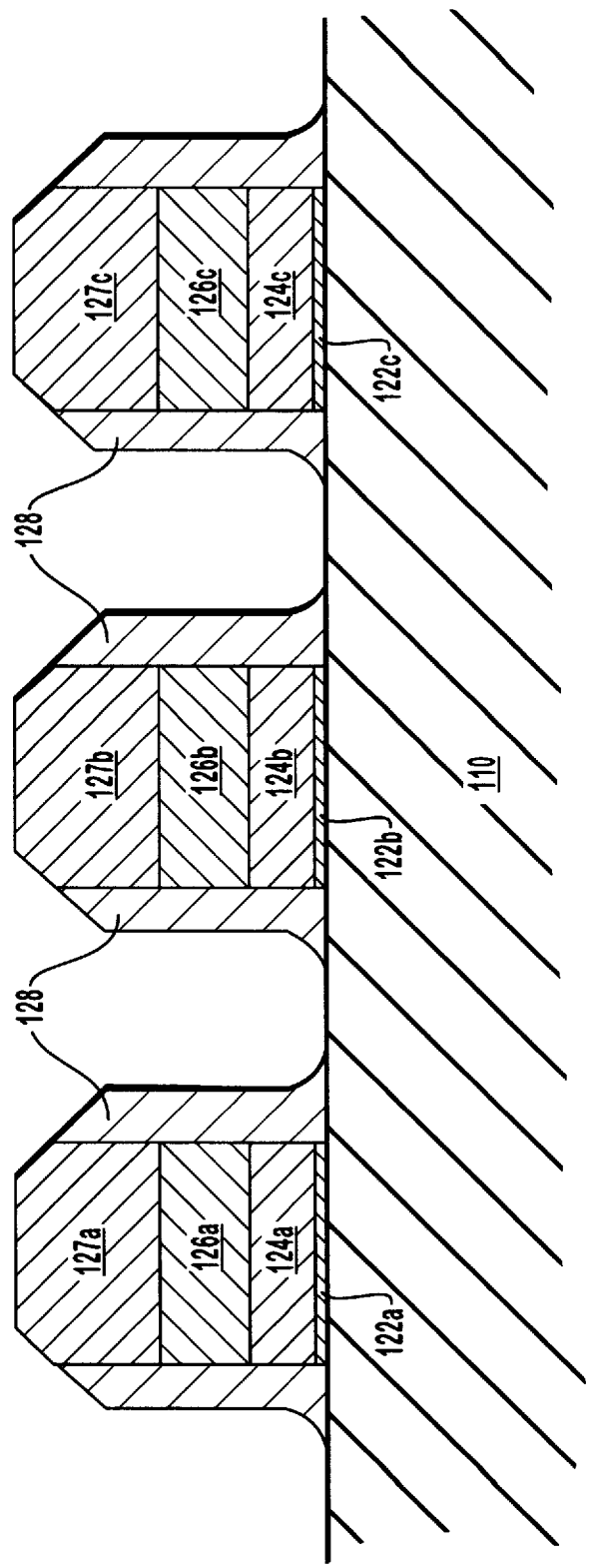
FIG. 8A is cross-sectional elevation view of the portion of a partially formed DRAM device of FIG. 8 after processing through a portion of one method of the second step of the process flow of FIG. 7.

FIG. 9 is the cross-sectional elevation view of FIG. 8 after processing through step 2 of FIG. 7, the nitride facet etch. The nitride spacers formed out of nitride layer 128 as a result of the nitride facet etch have much more material removed near the top corners of the gate structure than with conventional processing, as best seen by comparison of spacers 128 of FIG. 9 with spacers 28 of FIG. 2. In FIG. 8A, even the top corners of thick nitride layers 127a, 127b, 127c have been removed.

Figure 9A:
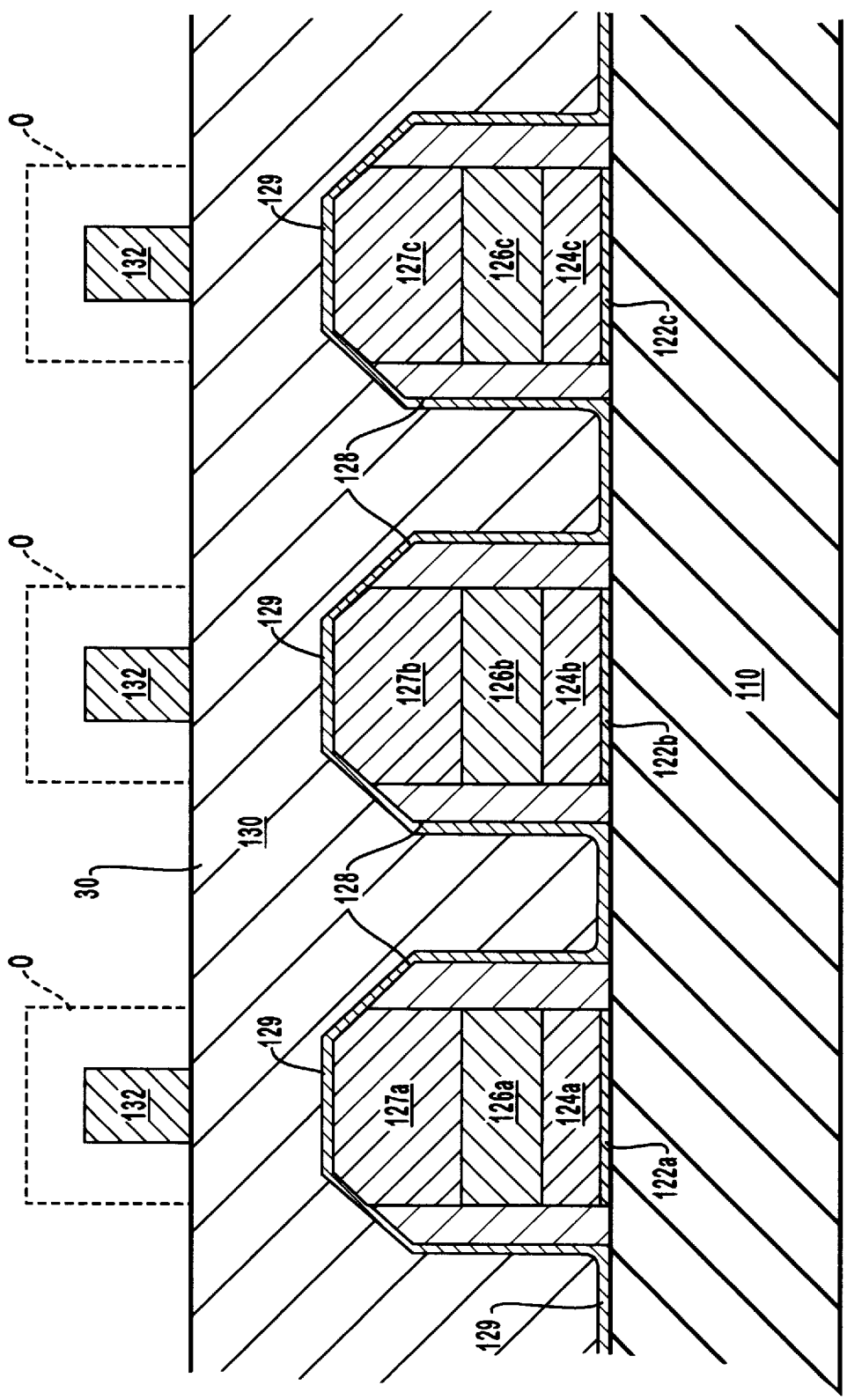
FIG. 9A is a cross-sectional elevation view of the portion of the partially formed DRAM device of FIG. 8 after processing through the fifth step and optional step 5.5 of the process flow of FIG. 7.

FIG. 9A is the cross-sectional elevation view of FIG. 9 after processing through step 5 and, if needed, optional step 5.5 of FIG. 7. If the photolithography process can directly form a patterned mask layer 132 of a desired line width as shown in FIG. 9A, no isotropic photoresist etch, optional step 5.5, is required. But if the photolithography is already at the limits of its resolution when forming the gates, then the minimum sizes of the line widths of patterned mask layer 132 will be as illustrated by dashed outlines O. Then an isotropic photoresist etch step, step 5.5, is required to reduce the size of the line widths of patterned mask layer 132 from the size of outlines O to the size shown in FIG. 9A in order to achieve a polyplug width beyond the printing capability of the photolithography.

Figure 6:
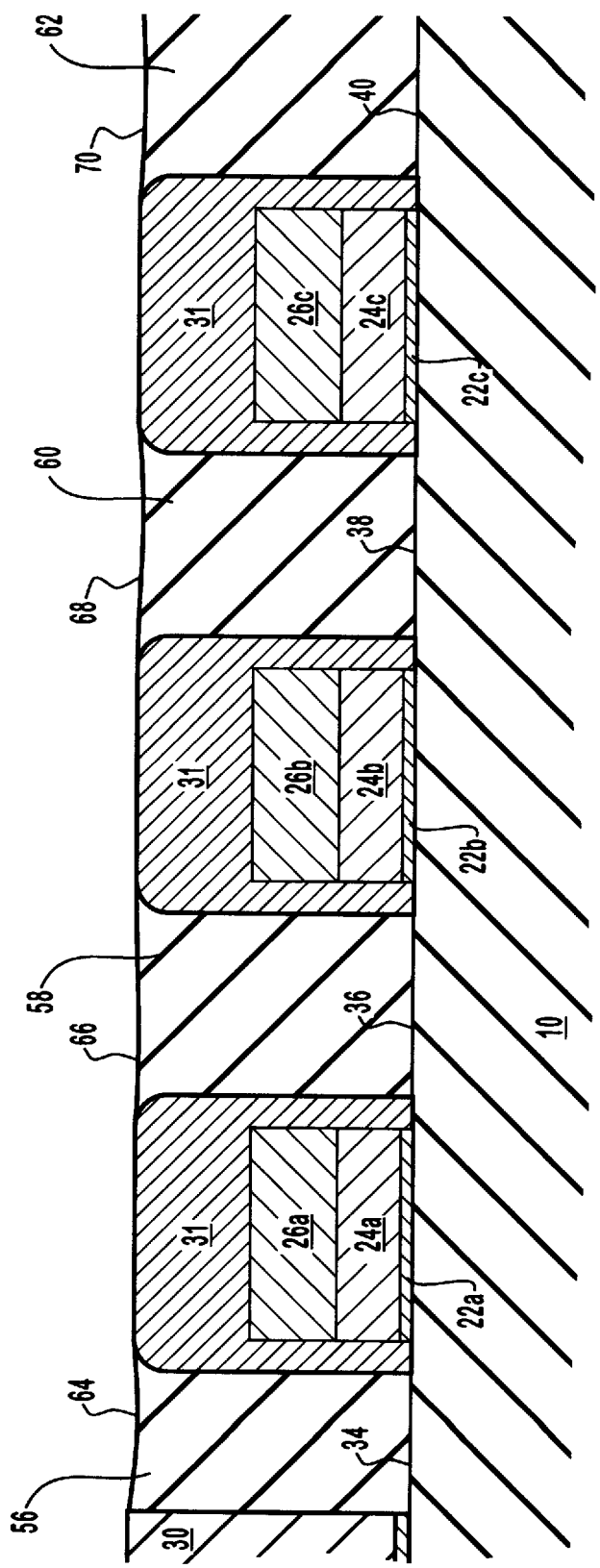
FIG. 6 is an alternate cross-sectional elevation view of the portion of the partially formed DRAM device of FIGS. 2–4 after completion of processing according to the conventional process flow of FIG. 1.
Figure 10:
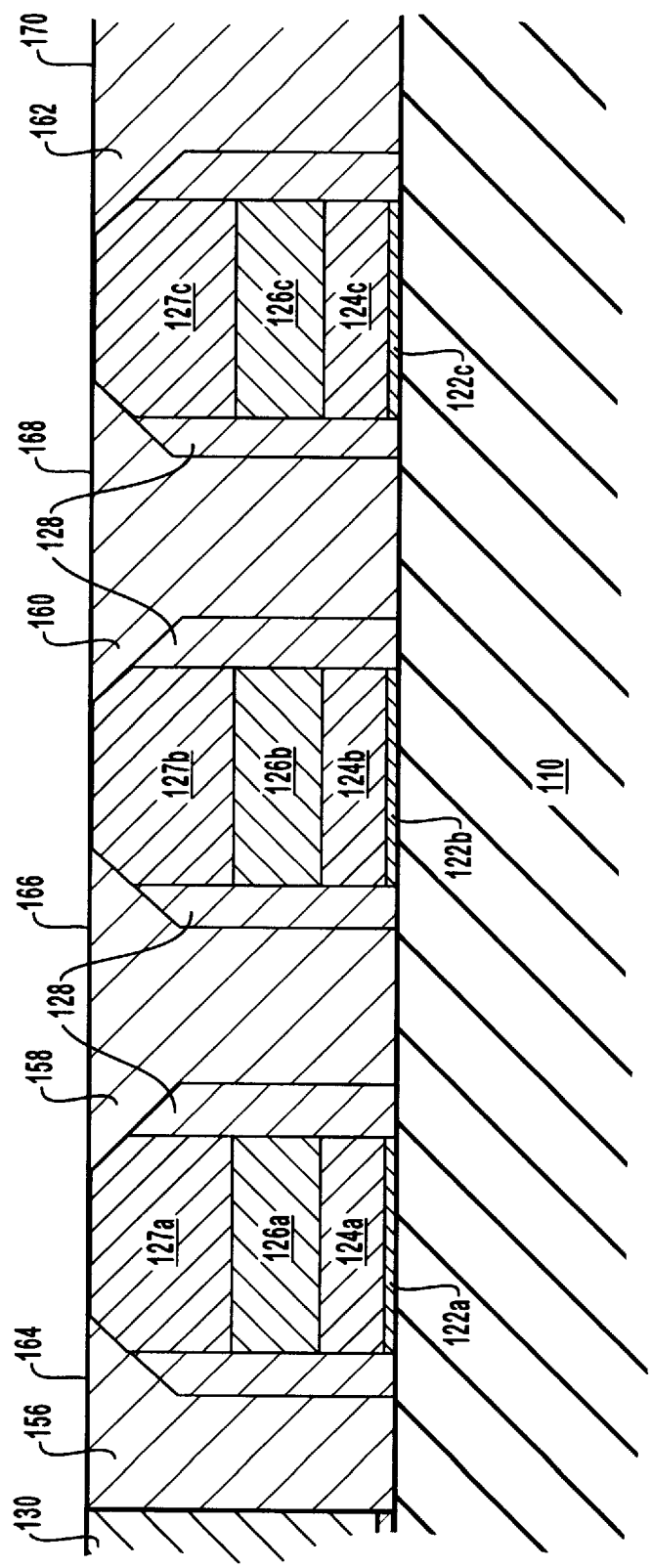
FIG. 10 is a cross-sectional elevation view of the portion of the partially formed DRAM device of FIG. 9 after completion of all processing according to the process flow of FIG. 7.

FIG. 10 is the cross-sectional elevation view of FIG. 9A after all processing steps of FIG. 7 have been performed. A portion of BPSG layer 130 remains at the left of FIG. 10. Doped polysilicon plugs 156, 158, 160, 162 have been formed in the spaces between the gate structures and have been polished down to the level of the gate/wordline nitride. The upward facing surfaces of plugs 156, 158, 160, 162 respectively constitute landing pads 164, 166, 168, 170. The facet etch of the nitride spacers results in landing pads 164, 166, 168, 170 of substantially larger area than with conventional processing, as may be seen by comparison with FIG. 6.

Step 2 of the process of FIG. 7, the facet etch of the spacer nitride, may be performed in at least two ways.

A first and presently preferred way to perform the facet etch of step 2 of the process of FIG. 7 is by sputter etching the nitride layer of step 1 in an argon plasma. During sputter etching in an argon plasma, energetic argon ions are made to impinge upon the wafer in a direction generally normal to the wafer surface. The argon ions thus impact upon and sputter only the horizontal surfaces of the nitride layer, and on those surfaces having a horizontal component.

With reference to FIG. 8 for example, those portions of nitride layer 128 located at the upper corners of gate/wordline stacks are more easily dislodged by the impinging argon ions than the nitride at other locations. The impinging argon ions perform a facet etch in which the portions of the nitride layer at the upper corners of the gate/wordline stacks are removed relatively rapidly at an angle of about 45°, while the more horizontal nitride surfaces are removed relatively slowly, and the vertical surfaces are left essentially intact. The selectivity of the etch for the 45° surfaces over the horizontal surfaces is sufficiently great that a separate conventional reactive ion etch ("RIE") may be required to complete removal of nitride layer 128 from the trenches between the gates/wordlines, resulting in the structure of FIG. 9.

The preferred sputter etch in an argon plasma may be performed, for example, in a Precision 5000 etcher, manufactured by Applied Materials, Inc., at moderate pressure and at high power. Pressure may be about 100 mTorr and power levels may be 600 W or above.

A second and alternative way to perform the facet etch of step 2 of the process of FIG. 7 is by subjecting the wafer to an RIE in which film-forming agents are added to the processing chamber. The film-forming agents tend to form a film over all exposed surfaces of the wafer. The film is continuously removed from the horizontal surfaces by impinging ions so that etching may occur at the horizontal surfaces. The vertical surfaces are protected from chemical etch reactions by the film formed thereon. At areas where the nitride film to be etched makes a transition from a horizontal to a vertical surface, a facet etch occurs, producing a surface at approximately a 45° angle. The facet etch occurs both at the top and bottom corners of the gate/wordline stacks, resulting in the structure shown in FIG. 8A. A slight over-etch will remove the remaining nitride from the trenches between the gates/wordlines, resulting in the structure shown in FIG. 9.

An appropriate RIE with film-forming agents may be performed for example in a Precision 5000 etcher at a power level of 600 W at a pressure of 200 mTorr with a 30 sccm flow of $CF_4$, and a 30 sccm flow of $CHF_3$. The $CHF_3$ causes a polymer film to form on the exposed nitride surfaces of the wafer. Increasing the polymer level in the RIE increases the relative amount of facet etch. Polymer levels may be increased by increasing the $CHF_3$ flow rate, increasing the pressure, decreasing the power, or any combination of these.

Figure 11:
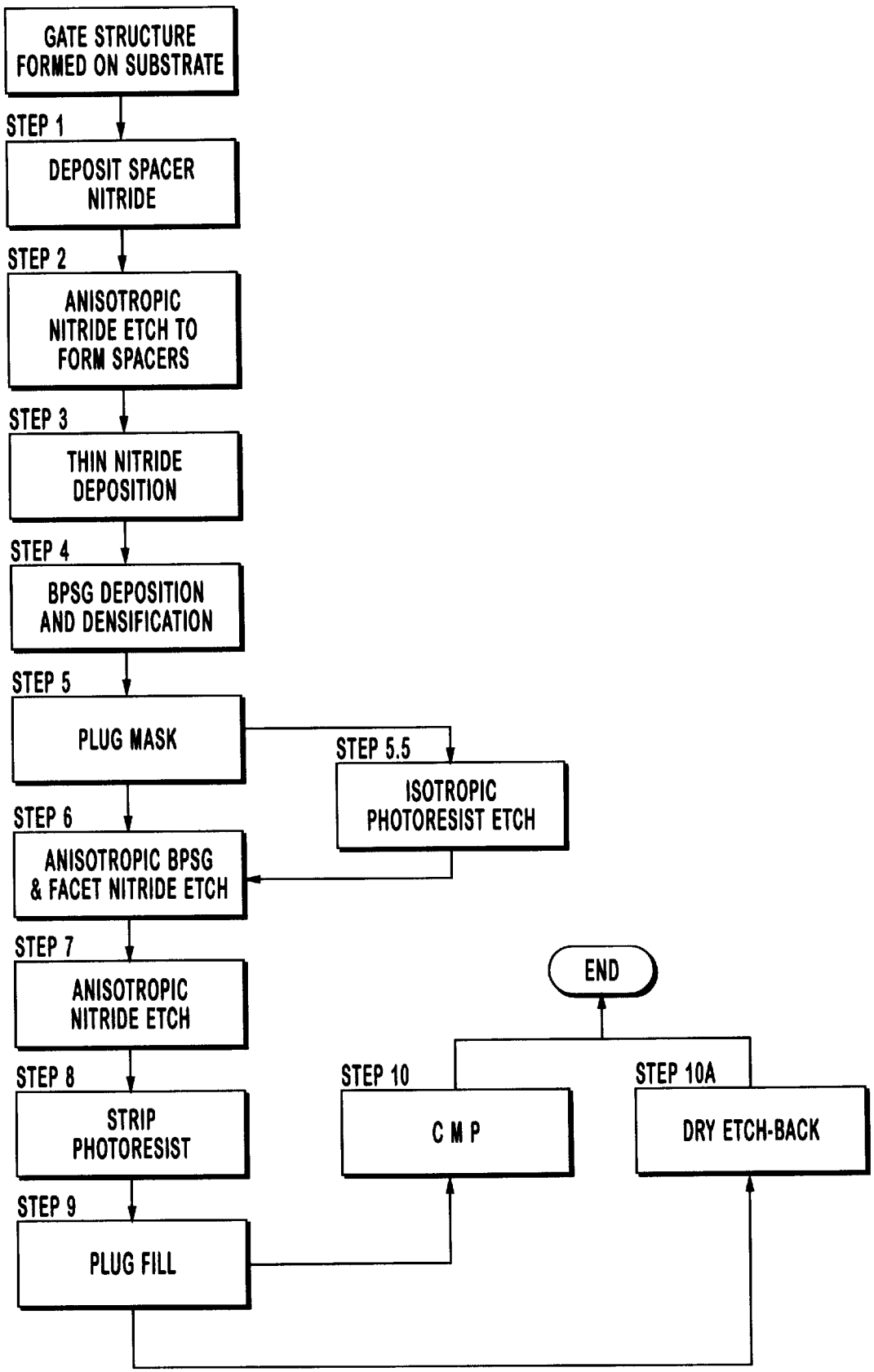
FIG. 11 is a flow diagram of a second process flow according to the present invention for producing self-aligned polyplugs having large landing pad areas.

A second preferred process flow for producing the large contact area plugs of the present invention is diagrammed in FIG. 11. In the process of FIG. 11, step 6 of the conventional process flow, an anisotropic BPSG etch, is replaced with a combined anisotropic BPSG etch and nitride facet etch. An optional step 5.5, an isotropic photoresist etch, may precede step 6. The isotropic photoresist etch, step 5.5, is used if it is desired to increase the size of the polyplug beyond the printing capability of the photolithography, as discussed above with respect to FIG. 9A and the process of FIG. 7.

Figure 12:
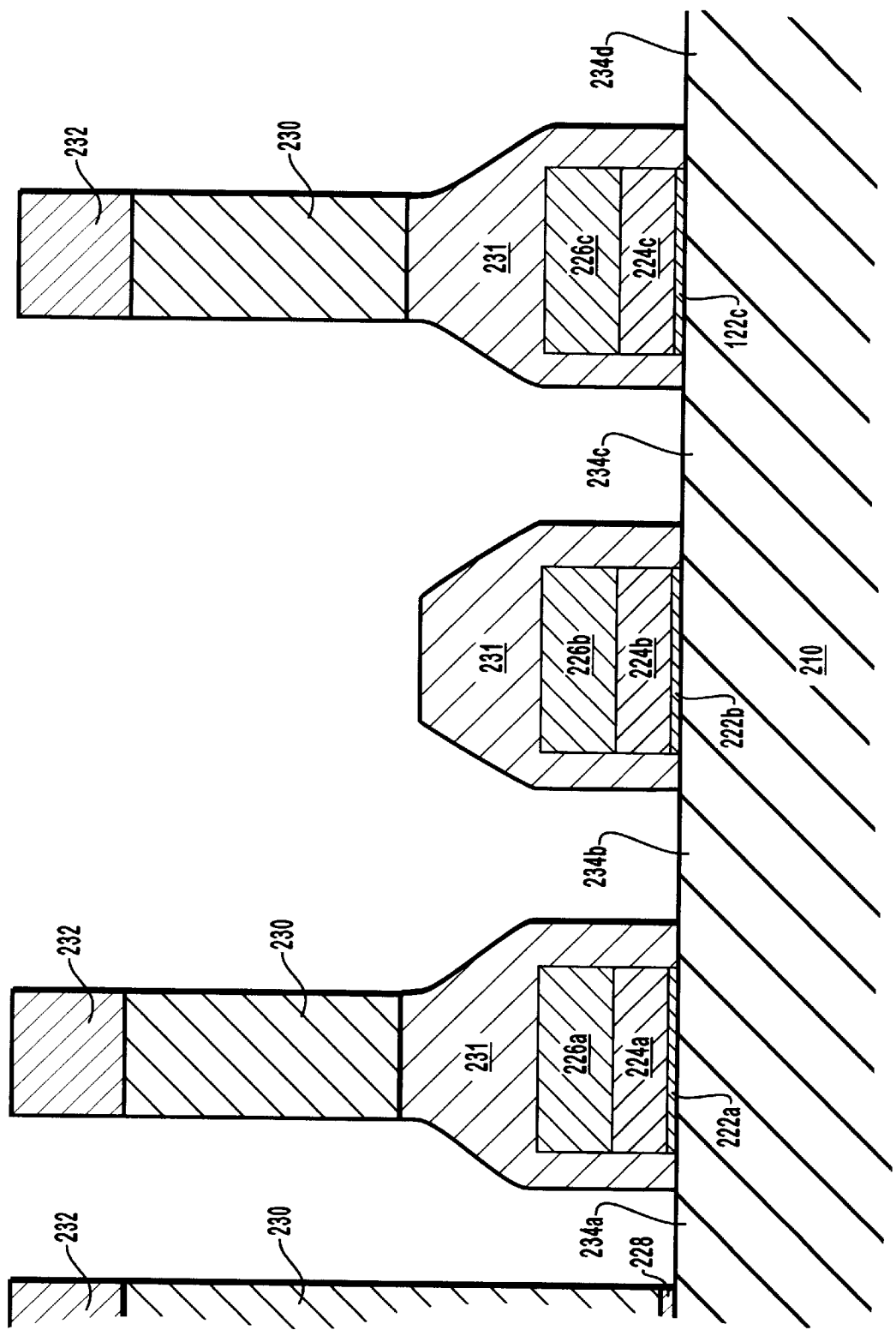
FIG. 12 is a cross-sectional elevation view of a portion of a partially formed DRAM device after processing through the sixth step of the process flow of FIG. 11.

FIG. 12 is a cross-sectional elevation view of a portion of a partially formed DRAM device after processing through step 6, the combined anisotropic BPSG etch and facet nitride etch, of the process flow of FIG. 11. A BPSG layer 230 has been removed in those areas not vertically shielded by a patterned a photoresist layer 232. A nitride layer 231 has been facet etched, and the portion of nitride layer 231 above source/drain regions 234a, 234b, 234c, 234d of substrate 210 has been removed.

Figure 13:
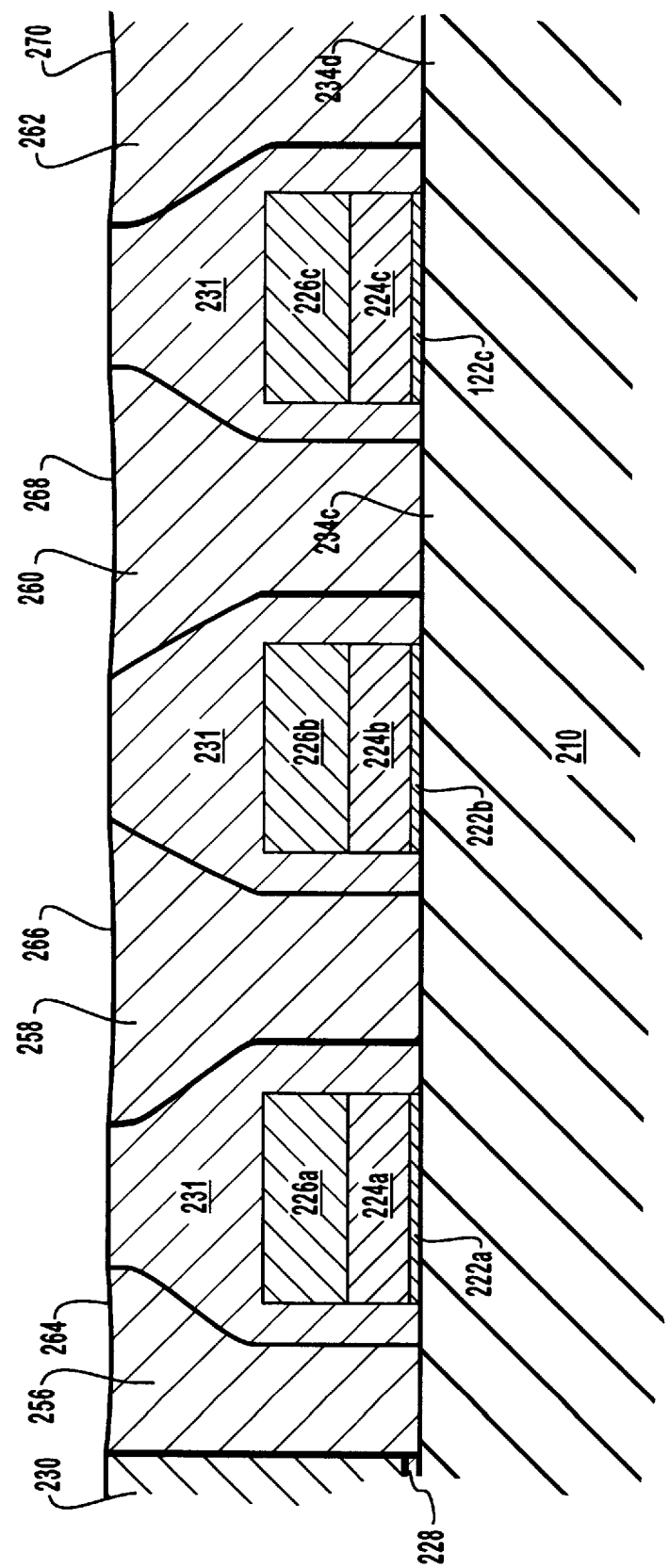
FIG. 13 is a cross-sectional elevation view of the portion of the partially formed DRAM device of FIG. 12 after all processing according to the process flow of FIG. 11.

FIG. 13 is the cross-sectional elevation view of the portion of a partially formed DRAM device of FIG. 12 after processing through all steps of the process flow of FIG. 11. A portion of BPSG layer 230 remains at the left of FIG. 13. Doped polysilicon has been deposited in the regions above the source/drain regions of substrate 210, and has been polished by CMP or etched by dry etch-back to the level of the nitride layer 231, resulting in doped polysilicon contact plugs 256, 258, 260, 262. The upward facing surfaces of doped polysilicon contact plugs 256, 258, 260, 262 respectively constitute landing pads 264, 266, 268, 270. Because of the facet etch of the nitride layer 231, landing pads 264, 266, 268, 270 are substantially larger than those produced by conventional processing as seen by comparison with FIG. 6.

Step 6 of the process of FIG. 11 may be performed for example by an RIE in which the number and energy of ions vertically impinging on the wafer surface is sufficient to sputter the top corners of the nitride layer covering the gate/wordline stack, resulting in a facet etch of the nitride layer. An inert gas may be added to the standard RIE to relatively increase the sputtering effect. Standard etch chemistries that chemically etch nitride may also be employed. Such etchants will etch the BPSG at a faster rate than nitride, resulting in facet formation at the top corners of the nitride covering the gate/wordline stacks, where the nitride is first and longest exposed to the etchants.

Figure 14:
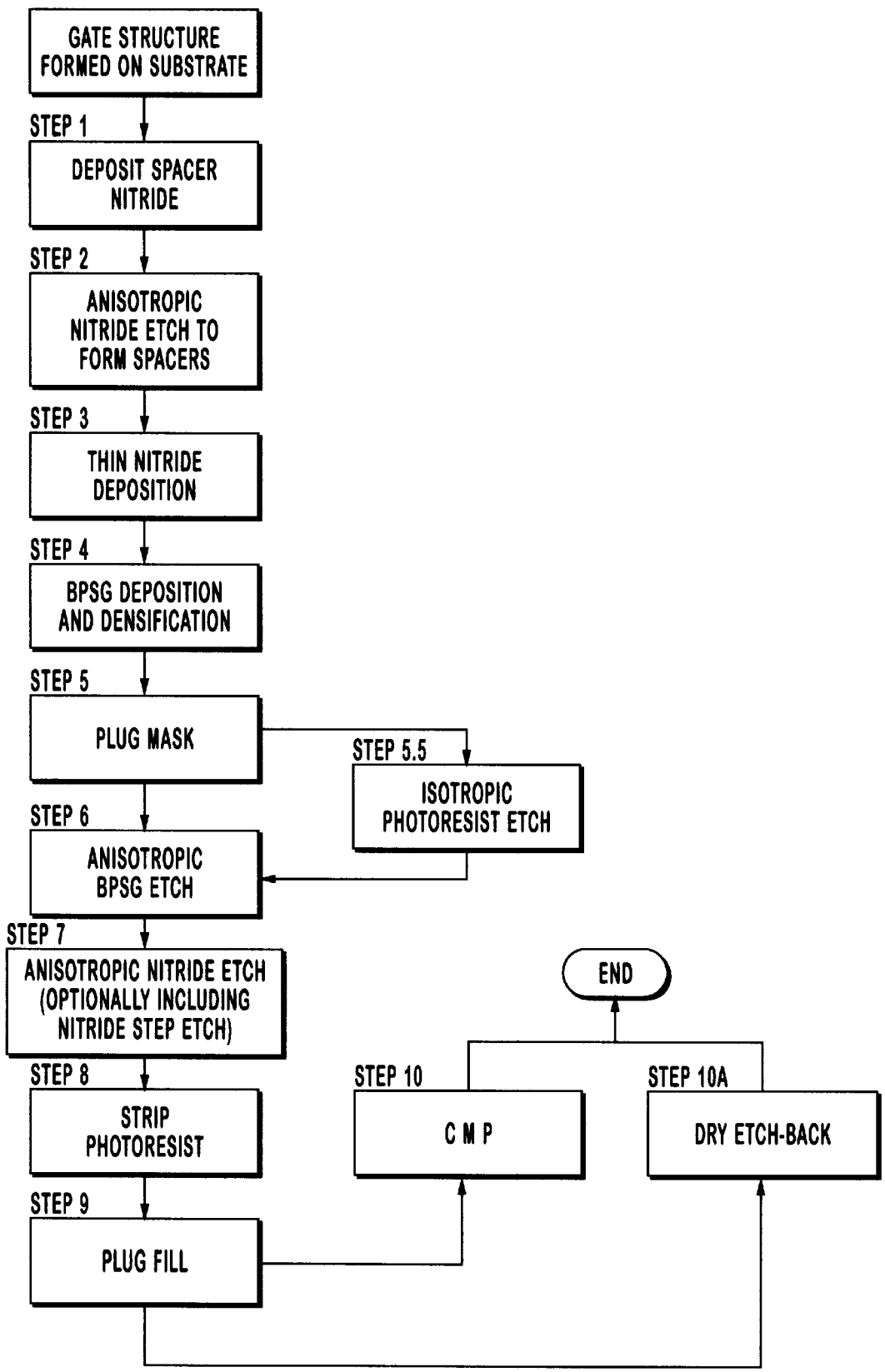
FIG. 14 is a flow diagram of a third process flow according to the present invention for producing self-aligned polyplugs having large landing pad areas.

FIG. 14 is a flow diagram of a third process flow according to the present invention for producing self-aligned polyplugs having large landing pad areas. In the process of FIG. 14, an optional step 5.5, an Isotropic Photoresist Etch, is inserted after step 5. Step 5.5 is used if it is necessary or merely desired to increase the size of the polyplug beyond the printing capabilities of the photolithography, as discussed above in reference to FIG. 9A and the process of FIG. 7.

Figure 15:
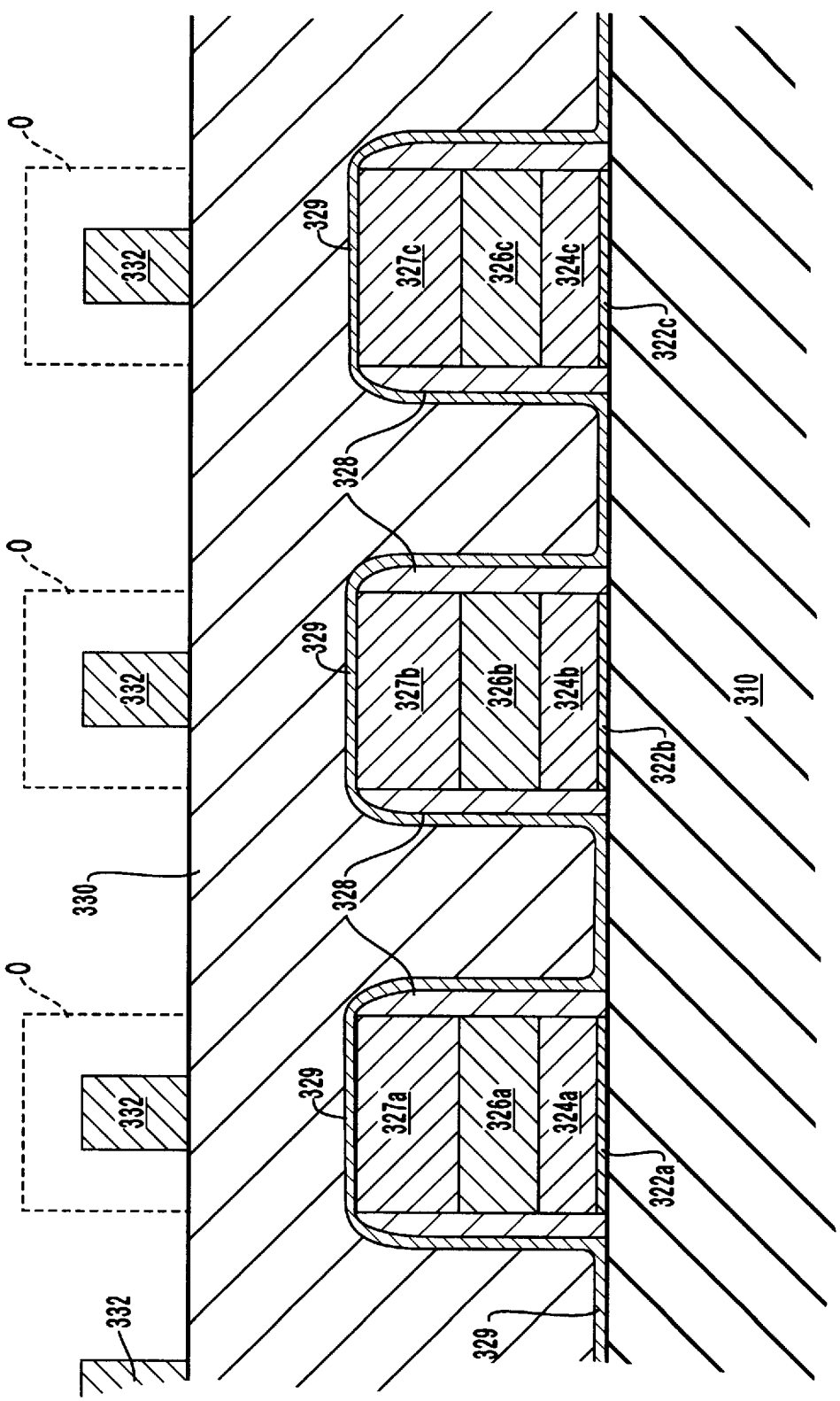
FIGS. 15 and 16 are cross-sectional elevation views of a portion of a partially formed DRAM device after processing through certain steps according to the process flow of FIG. 14.

FIG. 15 is a cross-sectional elevation view of a portion of a partially formed DRAM device after processing through step 5, the plug mask of the process flow of FIG. 14. Three gate structures have been formed upon a substrate 310, each gate including a gate oxide 322a, 322b, 322c respectively, a polysilicon gate 324a, 324b, 324c respectively, with each polysilicon gate topped by a tungsten silicide layer 326a, 326b, 326c, and a thick nitride layer 327a, 327b, 327c respectively. All of the gates have been enclosed laterally by spacers 328, and laterally and vertically by a nitride film 329, and a BPSG layer 330 has been deposited and densified over nitride film 329. A patterned photoresist layer 332 has been formed on the surface of BPSG layer 330. If the minimum line width of the patterned photoresist corresponds to that shown by outline O, the optional isotropic photoresist etch, step 5.5 of the process of FIG. 14, is used to reduce the patterned photoresist 332 to the size shown.

Figure 16:
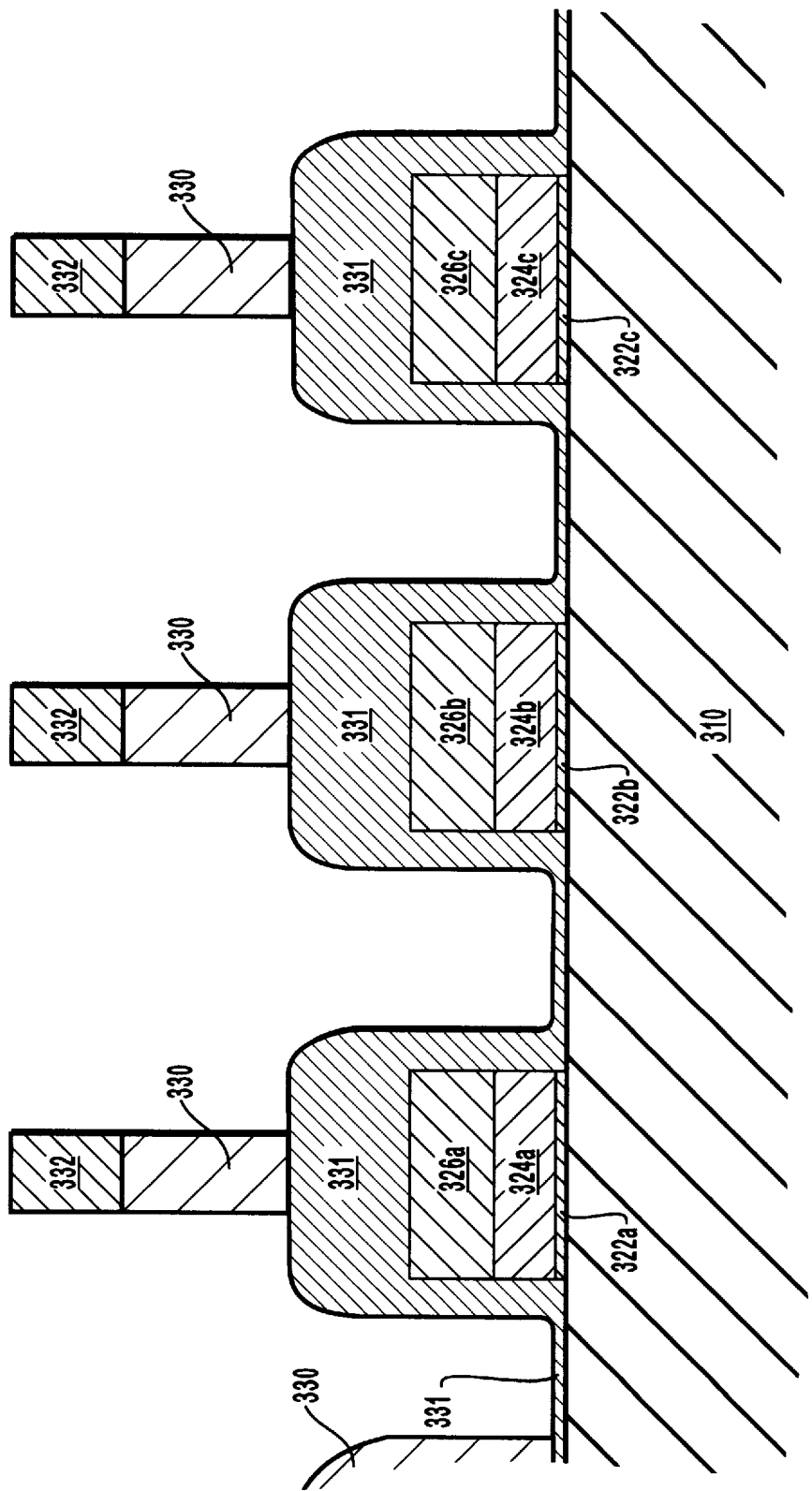

FIG. 16 is a cross-sectional elevation view of the portion of a partially formed DRAM device of FIG. 15 after processing through step 6, the BPSG etch step, of the process flow of FIG. 14. BPSG layer 330 has been etched vertically.

Figure 17:
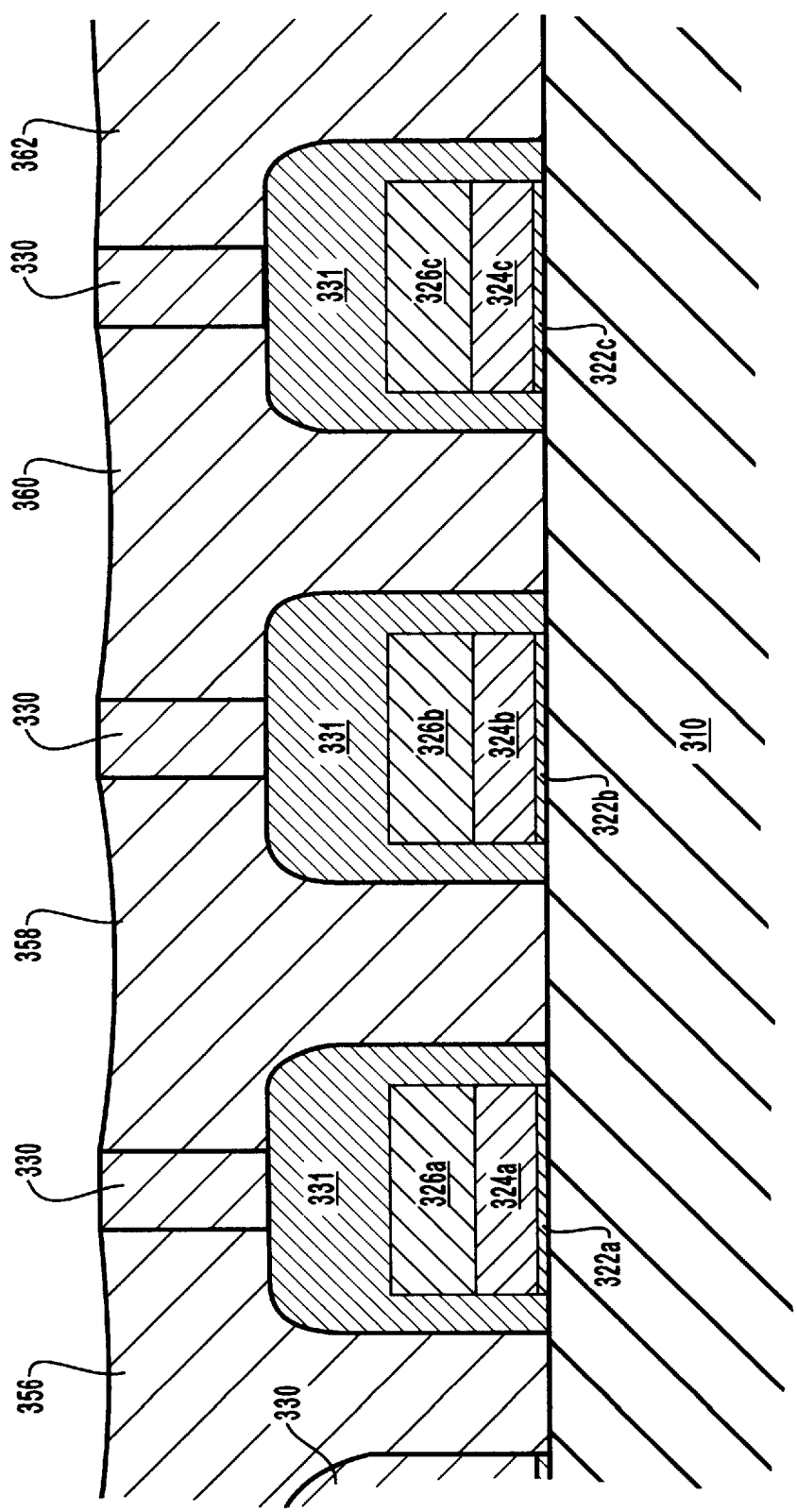
FIG. 17 is a cross-sectional elevation view of the portion of the partially formed DRAM device of FIGS. 15 and 16 after completion of processing according to the process flow of FIG. 14.

FIG. 17 is the cross-sectional elevation view of the portion of a partially formed DRAM device of FIG. 16 after processing through all steps of the process flow of FIG. 14, but with the CMP or dry etch-back not applied down to the level of nitride 328. This results, with the use of optional step 5.5, in contact plugs 356, 358, 360, 362 having relatively larger landing pads than possible with previously known processes, but does not take advantage of the more planar nature of the top surface possible with CMP down to the level of nitride 328.

Figure 18:
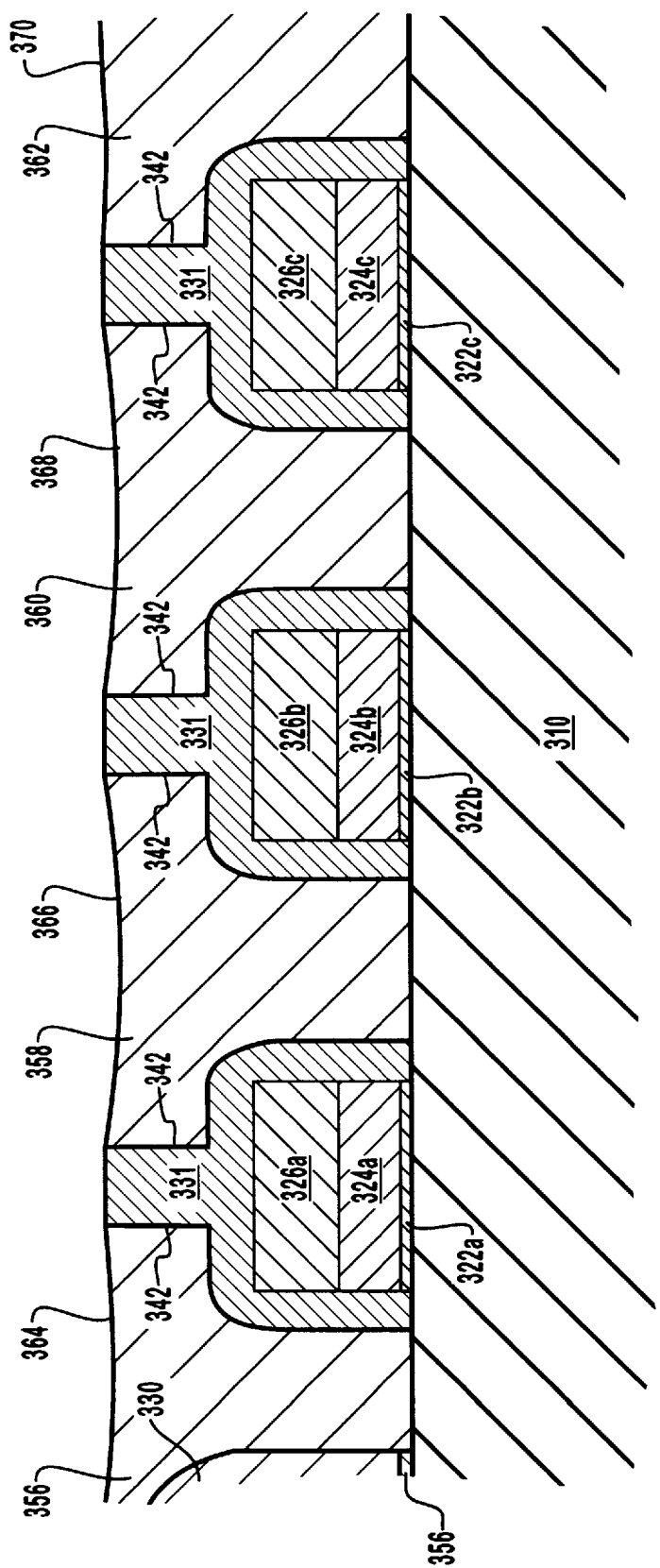
FIG. 18 is an alternate cross-sectional elevation view of the portion of the partially formed DRAM device of FIGS. 15 and 16 after completion of processing according to the process flow of FIG. 14.

FIG. 18 shows an elevational cross section of the resulting structure after CMP or dry etch-back down to the nitride level in step 10 of the process flow of FIG. 14. If the CMP or dry etch-back is to be performed down to the top of nitride 331, then the optional nitride step etch must be performed by an anisotropic nitride etch in step 7 of sufficient depth to form steps 342 as shown in FIG. 18, and optional step 5.5 must also have been performed if necessary. This results in self-aligned polysilicon contact plugs 356, 358, 360, 362 have having landing pads 364, 366, 368, 370 larger than possible with conventional processing.

Figure 19:
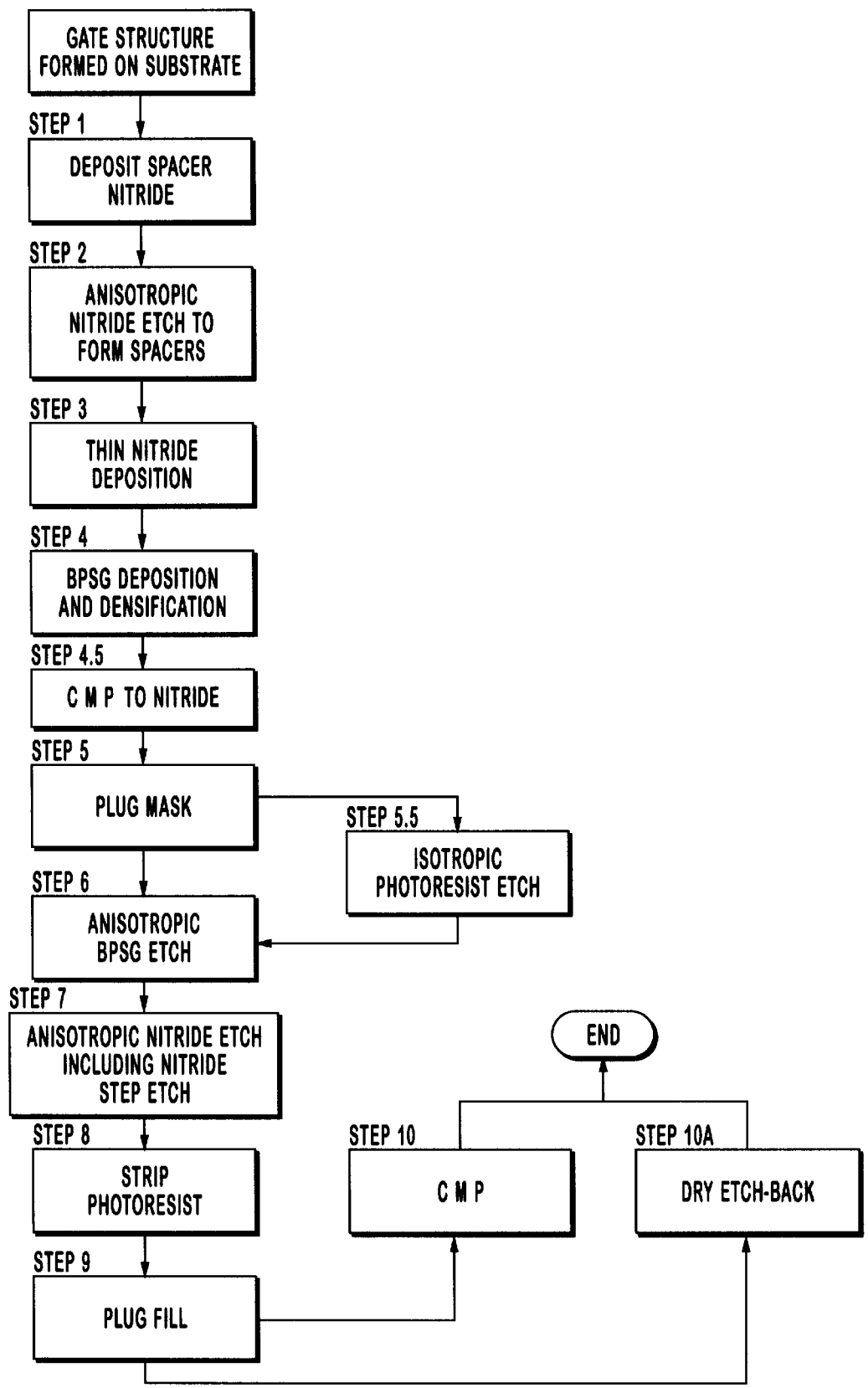
FIG. 19 is a flow diagram of a fourth process flow according to the present invention for producing self-aligned polyplugs having large landing pad areas.

FIG. 19 is a flow diagram of a fourth process flow according to the present invention for producing self-aligned polyplugs having large landing pad areas. In the process of FIG. 19, step 4.5, a CMP down to the nitride level, has been added to the conventional process flow, as has optional step 5.5, an isotropic photoresist etch or partial descum. The effects of these process modifications are illustrated in FIGS. 20–22.

Figure 20:
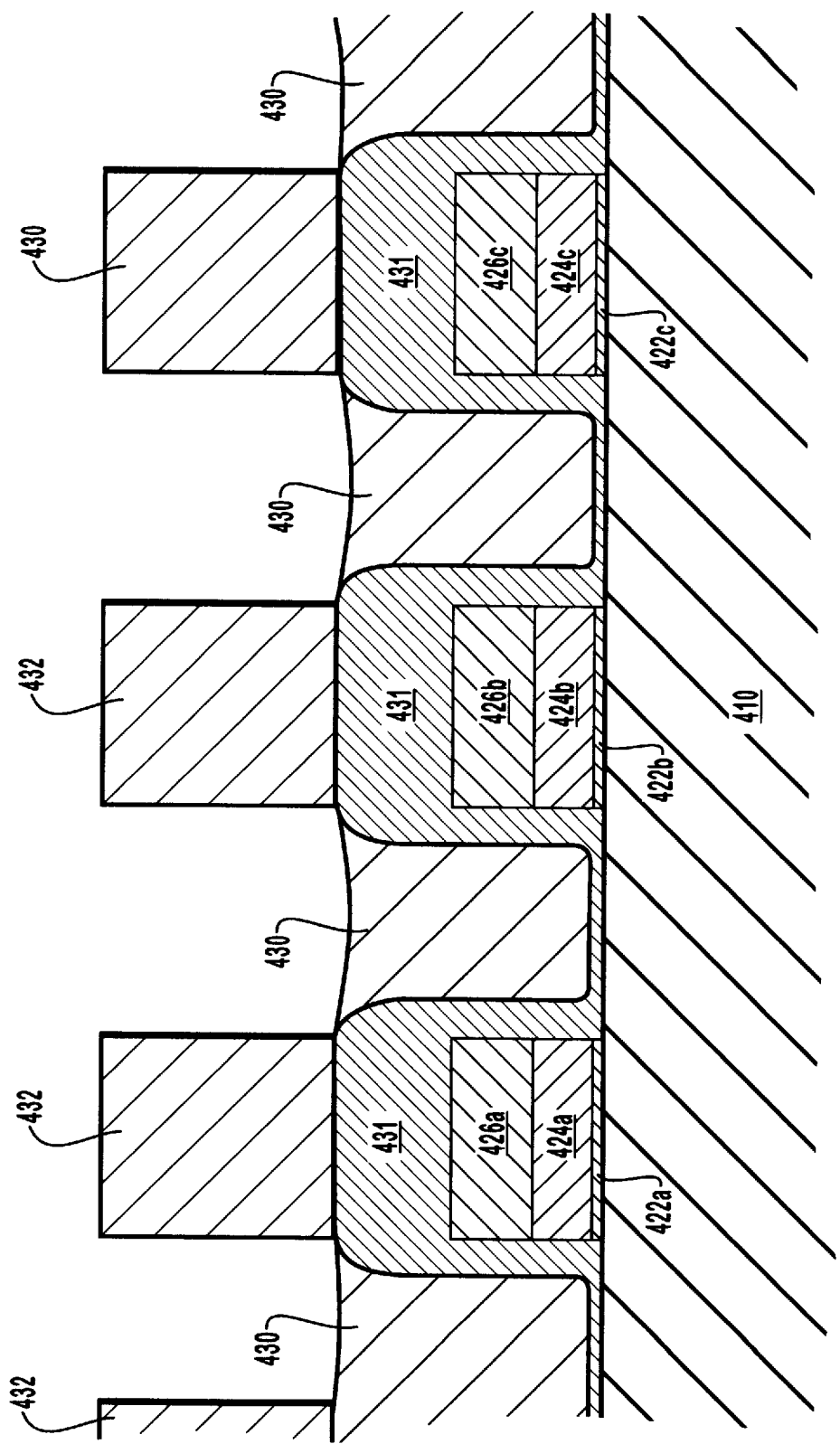
FIGS. 20 and 21 are cross-sectional elevation views of a portion of a partially formed DRAM device after processing through certain steps according to the process flow of FIG. 19.

FIG. 20 is a cross-sectional elevation view of a portion of a partially formed DRAM device after processing through step 5, the plug mask step of the process flow of FIG. 19. Three gate structures have been formed upon a substrate 410, each gate including a gate oxide 422a, 422b, 422c respectively, a polysilicon gate 424a, 424b, 424c respectively, with each polysilicon gate topped by a tungsten silicide layer 426a, 426b, 426c respectively. All of the gate structures have been enclosed over substrate 410 by a nitride layer 431, and a BPSG layer 430 has been deposited and densified over nitride layer 431. BPSG layer 430 has been polished by CMP down to the top of nitride layer 431. A patterned photoresist layer 432 has been formed on the CMP-produced surface.

Figure 21:
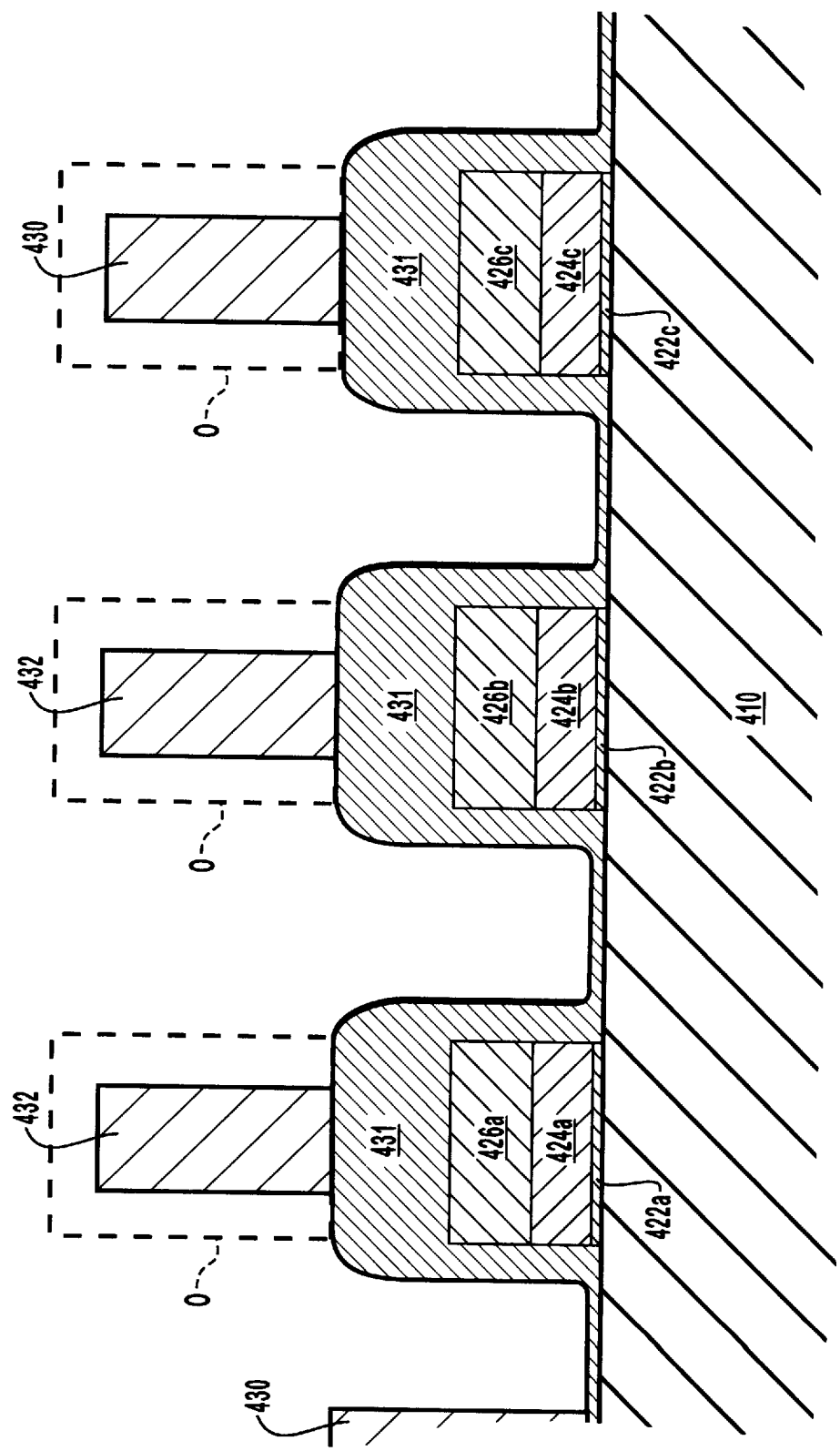

FIG. 21 is the cross-sectional elevation view of the portion of a partially formed DRAM device of FIG. 20 after processing through optional step 5.5, the isotropic photoresist etch step of the process flow of FIG. 19. The BPSG layer 430 has been etched away in the locations not vertically shielded by patterned photoresist 432 shown in FIG. 20. The photoresist itself has then been etched by an isotropic photoresist etch, such that material is removed from both the top and sides of each remaining portion of photoresist. The material removed corresponds to the space within outlines O. This results in a remaining patterned photoresist layer 432 with features potentially smaller than the smallest feature size achievable by photolithography alone. Nitride layer 431 remains virtually unaffected. If sufficiently small patterned photoresist such as patterned photoresist 432 of FIG. 21 can be formed directly by photolithography, optional step 5.5 is not required.

Figure 22:
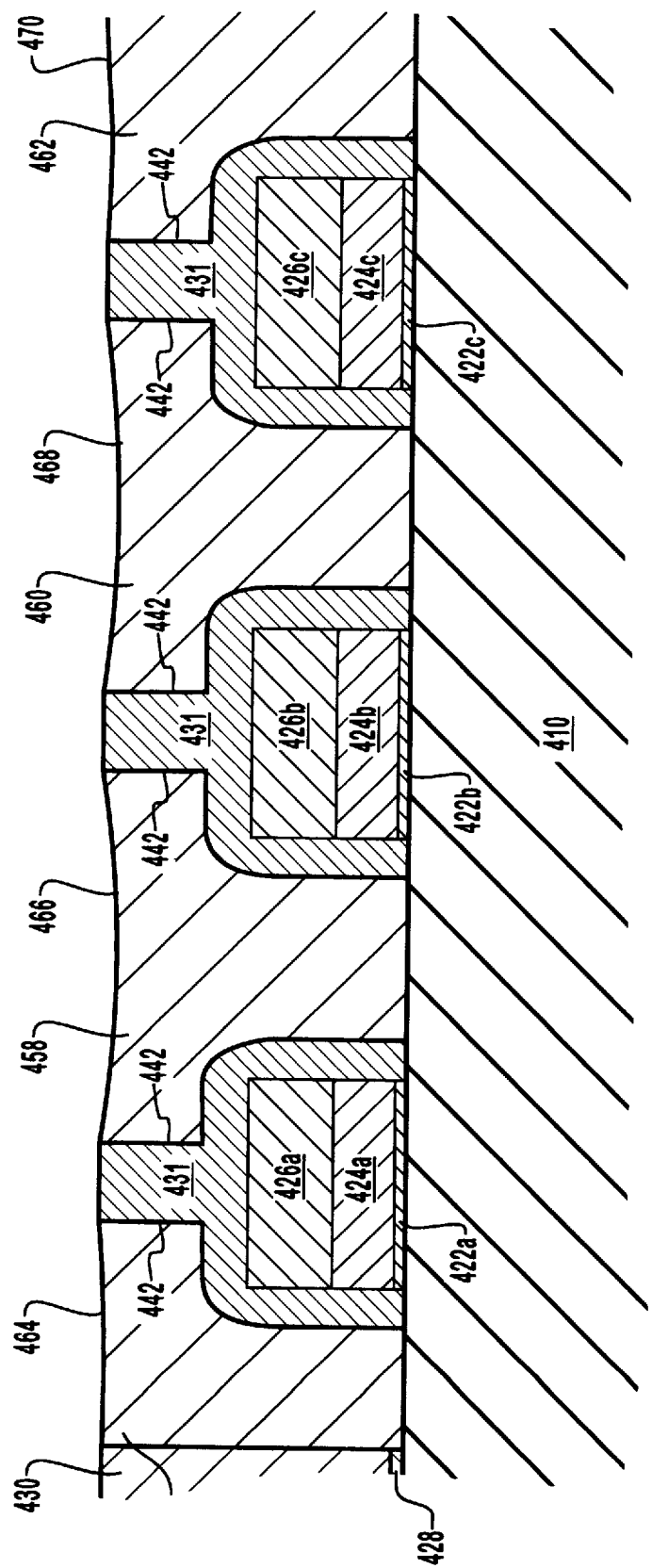
FIG. 22 is a cross-sectional elevation view of the portion of the partially formed DRAM device of FIGS. 20 and 21 after completion of processing according to the process flow of FIG. 19.

FIG. 22 is the cross-sectional elevation view of the portion of a partially formed DRAM device of FIG. 21 after processing through all steps of the process flow of FIG. 19. Steps 442 have been etched into shoulder regions of nitride layer 431 in the locations unshielded by the portions of patterned photoresist layer remaining in FIG. 21. The remaining photoresist has then been stripped, and the plug locations have been filled with doped polysilicon. CMP or dry etch-back has then been performed down to the level of nitride layer 431. This results in contact plugs 456, 458, 460, 462 having landing pads 464, 466, 468, 470 substantially larger than possible with the conventional process flow of FIG. 1.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for preparing an integrated circuit structure, said structure having a substrate with a plurality of gate stacks and associated contact regions formed thereon, each of said gate stacks having a bottom at said substrate, a top above said substrate, sides extending upward from said bottom to said top, and top corners at the convergence of said top and said sides, said method comprising:

depositing a dielectric enclosure layer over said substrate and said plurality of gate stacks, etching said dielectric enclosure layer to form facets thereon and to expose at least one of said contact regions, said facets being formed on said dielectric enclosure layer at the top corners of said gate stacks;

producing a dielectric planarization layer over said substrate and all structures thereon;

selectively removing said dielectric planarization layer at least over one of said contact regions;

depositing a layer of conducting material to contact at least one of said contact regions; and removing all material deposited over the substrate from the top down to a depth at least as low as a top of said dielectric planarization layer, said depth being selected to provide that said layer of conductive material remains in contact with at least one of said facets after said all material has been removed.

2. The method of claim 1 wherein etching said dielectric enclosure layer comprises sputter-etching said dielectric enclosure layer.

3. The method of claim 2 wherein etching said dielectric enclosure layer further comprises performing a reactive ion etch of said dielectric enclosure layer.

4. The method of claim 1 wherein etching said dielectric enclosure layer comprises performing a reactive ion etch of said dielectric enclosure layer, said reactive ion etch including a film-forming agent introduced therein.

5. The method of claim 1 wherein removing all material deposited on the substrate from the top down comprises chemical mechanical polishing.

6. The method of claim 1 wherein removing all material deposited on the substrate from the top down comprises a dry etch-back step.

7. The method of claim 1 wherein removing all material deposited on the substrate from the top down is performed to a depth at least as low as the top of said dielectric enclosure layer.

8. The method of claim 1 in which said facets are formed on said dielectric enclosure layer at an angle of 45±10 degrees to the substrate.

9. The method of claim 1 wherein removing all material deposited on the substrate from the top down comprises a dry etch-back step.

10. A method for preparing an integrated circuit structure, said structure having a silicon substrate with a plurality of gate stacks and associated contact regions formed thereon, each of said gate stacks having a bottom at said substrate, a top above said substrate, sides extending upward from said bottom to said top, and top corners at the convergence of said top and said sides, each of said gate stacks being enclosed in a silicon nitride enclosure layer, said method comprising:

producing a BPSG planarization layer over said substrate and all structures thereon;

selectively removing said BPSG planarization layer over at least one of said contact regions and etching said silicon nitride enclosure layer to form facets thereon at the top corners of said gate stacks;

depositing a layer of doped polysilicon to contact at least one of said contact regions; and removing all material deposited over the substrate from the top down to a depth at least as low as a top of said dielectric planarization layer.

11. The method of claim 10 wherein removing all material deposited on the substrate from the top down comprises chemical mechanical polishing.

12. The method of claim 10 wherein removing all material deposited on the substrate from the top down is performed to a depth at least as low as the top of said silicon nitride enclosure layer.

13. A method for preparing an integrated circuit structure, said structure having a substrate with a plurality of gate stacks and associated contact regions formed thereon, each of said gate stacks being enclosed in a dielectric enclosure layer, said dielectric enclosure layer having a bottom at said substrate, a top above said substrate, sides extending upward from said bottom to said top, and a shoulder region at the convergence of said top and said sides, said method comprising:

etching said shoulder region to form a facet;

producing a dielectric planarization layer over said substrate;

providing a patterned photoresist layer upon said dielectric planarization layer;

isotropically etching said dielectric planarization layer to remove said dielectric planarization layer and expose said contact regions, wherein a stack of said dielectric planarization layer extends from the top of each said dielectric enclosure layer;

depositing a layer of conducting material to contact said contact regions and said facet; and removing material deposited over the substrate to isolate the conducting material above the substrate between each said stack of said dielectric planarization layer extending from the top of said dielectric enclosure layer.

14. A method for preparing an integrated circuit structure, said structure having a substrate with a plurality of gate stacks and associated contact regions formed thereon, each of said gate stacks being enclosed in a dielectric enclosure layer, said dielectric enclosure layer having a bottom at said substrate, a top above said substrate, sides extending upward from said bottom to said top, and a shoulder region at the convergence of said top and said sides, said method comprising:

producing a dielectric planarization layer over said substrate;

providing a patterned photoresist layer upon said dielectric planarization layer;

etching said dielectric planarization layer to remove said dielectric planarization layer over at least one shoulder region of the dielectric enclosure layer enclosing the gate stacks, and to expose at least one of said contact regions;

etching at least one shoulder region of the dielectric enclosure layer enclosing the gate stacks to form a facet at the shoulder region of the dielectric enclosure layer;

depositing a layer of conducting material to contact said at least one of said contact regions and to contact the facet at the shoulder region of the dielectric enclosure layer; and removing material over the substrate to a depth at least as low as the facet at the shoulder region of the dielectric enclosure layer.

15. The method of claim 14 wherein said etching at least one shoulder region of the dielectric enclosure layer comprises isotropically etching said dielectric enclosure layer.

16. The method as defined in claim 14, wherein each said gate stack has an electrically conductive gate electrode with a width, and wherein said etching at least one shoulder region of the dielectric enclosure layer enclosing the gate stacks comprises:

etching each said dielectric enclosure layer so as to have:
a width at the top that is less than or equal to the width of the electrically conductive gate electrode; and
a width at the bottom that is greater then the width of the electrically conductive gate electrode.

17. A method for preparing an integrated circuit structure, said structure having a substrate with a plurality of gate stacks and associated contact regions formed thereon, each of said gate stacks having a bottom at said substrate, a top above said substrate, sides extending upward from said bottom to said top, and top corners at the convergence of said top and said sides, each of said gate stacks being enclosed in a dielectric enclosure layer, said dielectric enclosure layer having a shoulder region at each of said top corners of said gate stacks, said method comprising:

producing a dielectric planarization layer over said substrate and all structures thereon;

removing for a first time all materials deposited over the substrate from the top down at least to the top of said dielectric enclosure layer enclosing the gate stacks, leaving a planar surface;

providing a patterned photoresist layer on said planar surface;

anisotropically etching said dielectric planarization layer to remove said dielectric planarization layer at areas left exposed by the patterned photoresist layer including an area over at least one of said contact regions;

isotropically etching said patterned photoresist layer to enlarge the areas left exposed by said patterned photoresist layer;

anisotropically etching a step in at least one shoulder region of the dielectric enclosure layer enclosing the gate stacks;

depositing a layer of conducting material to contact at least one of said contact regions; and removing for a second time all material deposited over the substrate from the top down to a depth at least as low as the top of the dielectric enclosure layer enclosing the gate stacks.

18. The method of claim 17 wherein removing for a first time all materials deposited on the substrate from the top down comprises chemical mechanical polishing.

19. The method of claim 17 wherein removing for a second time all materials deposited on the substrate from the top down comprises chemical mechanical polishing.

20. The method of claim 17 wherein removing for a second time all materials deposited on the substrate from the top down comprises a dry etch-back step.

21. A method for preparing an integrated circuit structure, said structure having a substrate with a plurality of gate stacks and associated contact regions formed thereon, each of said gate stacks having an electrically conductive gate electrode with a width, said method comprising:

forming a dielectric enclosure layer so as to enclose each said gate stack, each said dielectric enclosure layer having:
a bottom at said substrate;
a top above said substrate and a facet between said top and bottom;
a width at the top that is less than or equal to the width of the electrically conductive gate electrode; and
a width at the bottom that is greater then the width of the electrically conductive gate electrode;
forming a dielectric planarization layer upon said contact regions and said dielectric enclosure layers;
selectively removing said dielectric planarization layer to expose said contact regions;
forming a layer of conducting material to contact said contact regions; and
forming contact plugs from the layer of conducting material, each contact plug being in contact with one of said contact regions and said facet and being isolated one from another by two of the dielectric enclosure layers.

22. A method for forming an integrated circuit structure, said structure having a substrate with a plurality of gate stacks and associated contact regions formed thereon, each of said gate stacks having an electrically conductive gate electrode, said method comprising:

forming a dielectric enclosure layer so as to enclose each said gate stack, each said dielectric enclosure layer having a bottom at said substrate, a top above said substrate, sides extending upward from said bottom to said top, and a shoulder region at the convergence of said top and said sides, wherein said contact regions are exposed;
selectively removing the dielectric enclosure layers to form facets at the shoulder regions thereon;
forming a dielectric planarization layer over said exposed contact regions and said dielectric enclosure layers;
selectively removing said dielectric planarization layer to expose said contact regions;
forming a layer of conducting material to contact said contact regions and to contact the facets at the shoulder region of the dielectric enclosure layer; and
forming contact plugs from the layer of conducting material, each contact plug being in contact with one of said contact regions and being isolated one from another by two of the dielectric enclosure layers.

23. The method as defined in claim 22, wherein forming contact plugs comprises removing the layer of conducting material above the facets at the shoulder regions.

24. A method for preparing an integrated circuit structure, said structure having a substrate with a plurality of gate stacks and associated contact regions formed thereon, each of said gate stacks having an electrically conductive gate electrode with a width, said method comprising:

forming a dielectric enclosure layer so as to enclose each said gate stack, each said dielectric enclosure layer having:
a bottom at said substrate;
a top above said substrate;
sides extending upward from said bottom to said top;
a shoulder region at the convergence of said top and said sides;
a width at the top that is less than or equal to the width of the electrically conductive gate electrode; and
a width at the bottom that is greater then the width of the electrically conductive gate electrode;
selectively removing the dielectric enclosure layers to form facets at the shoulder regions thereon;
forming a dielectric planarization layer upon said contact regions and said dielectric enclosure layers;
selectively removing said dielectric planarization layer to expose said contact regions;
forming a layer of conducting material to contact said contact regions and to contact the facets at the shoulder region of the dielectric enclosure layer; and
forming contact plugs from the layer of conducting material, each contact plug being in contact with one of said contact regions and being isolated one from another by two of the dielectric enclosure layers.

25. The method as defined in claim 24, wherein said forming contact plugs comprises removing the layer of conducting material above the facets at the shoulder regions.

* * * * *

UNITED STATES PATENT AND TRADEMARK OFFICE
CERTIFICATE OF CORRECTION

PATENT NO. : 5,858,865

DATED : Jan. 12, 1999

INVENTOR(S) : Werner Juengling; Kirk Prall; Gordon Haller; David Keller; Tyler Lowrey It is certified that error appears in the above-identified patent and that said Letters Patent is hereby corrected as shown below:

Col. 2, line 45, after "nitride" change "layer" to --spacers--

Col. 6, line 10, after "the" change "comers" to --corners--

Col. 6, line 30, after "of" change "spacers" to --nitride layer--

Col. 7, line 5, after "upper" change "comers" to --corners--

Col. 7, line 9, after "upper" change "comers" to --corners--

Col. 7, line 36, after "bottom" change "comers" to --corners--

Col. 7, line 66, after "patterned" delete --a--

Col. 8, line 26, after "top" change "comers" to --corners--

Col. 8, line 65, after "of" change "nitride" to --spacers--

Col. 9, line 13, before "having" delete --have--

Col. 9, line 40, after "step" change "5.5" to --6.5--

Col. 9, line 42, after "photoresist" insert --layer--

Col. 9, line 52, after "photoresist" insert --layer--

Col. 12, line 22, after "greater" change "then" to --than--

UNITED STATES PATENT AND TRADEMARK OFFICE
CERTIFICATE OF CORRECTION

PATENT NO. : 5,858,865

DATED : Jan. 12, 1999

INVENTOR(S) : Werner Juengling; Kirk Prall; Gordon Haller; David Keller; Tyler Lowrey It is certified that error appears in the above-identified patent and that said Letters Patent is hereby corrected as shown below:

Col. 13, line 14, after "greater" change "then" to --than--

Col. 14, line 26, after "greater" change "then" to --than--

Signed and Sealed this

Fourteenth Day of September, 1999

Attest:

Q. TODD DICKINSON

*Attesting Officer*     *Acting Commissioner of Patents and Trademarks*